(12) United States Patent
Fang et al.

(10) Patent No.: US 6,266,001 B1
(45) Date of Patent: Jul. 24, 2001

(54) METHOD AND APPARATUS FOR SWITCHING LOW VOLTAGE CMOS SWITCHES IN HIGH VOLTAGE DIGITAL TO ANALOG CONVERTERS

(75) Inventors: Gary G. Fang, San Jose; David Castaneda, Sunnyvale; Chowdhury F. Rahim, Saratoga, all of CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 09/305,908

(22) Filed: May 5, 1999

(51) Int. Cl.[7] ....................................... H03M 1/66
(52) U.S. Cl. ............................. 341/144; 327/207
(58) Field of Search ............................ 341/154, 144, 341/136; 327/207; 330/277

(56) References Cited

FOREIGN PATENT DOCUMENTS

WO 97/43833    11/1997  (WO) .

OTHER PUBLICATIONS

Richard C. Dorf, The Electrical Engineering Handbook, 1993, pp. 771–775, 781–782, CRC Press, Inc., Boca Raton.

*Primary Examiner*—Peguy Jean Pierre
(74) *Attorney, Agent, or Firm*—Blakely, Sokoloff, Taylor & Zafman LLP

(57) ABSTRACT

A varying power supply range, that can exceed the breakdown voltage of switches within a DAC, is used to generate positive and negative generated OFF voltages substantially fixed and less than the breakdown voltage to accommodate a wide range of analog reference voltages and power supply voltages. The digital input signal having digital input levels is received by a TTL/CMOS input receiver and level shifted to logic levels having the positive and negative generate voltage levels. A circuit matches switch resistance and forms positive and negative switch ON voltage levels from the voltage levels of the input positive and negative analog reference levels. Switch drivers properly drive control terminals of the switches with appropriate voltage levels avoiding switch breakdown in response to the digital input signal.

48 Claims, 11 Drawing Sheets

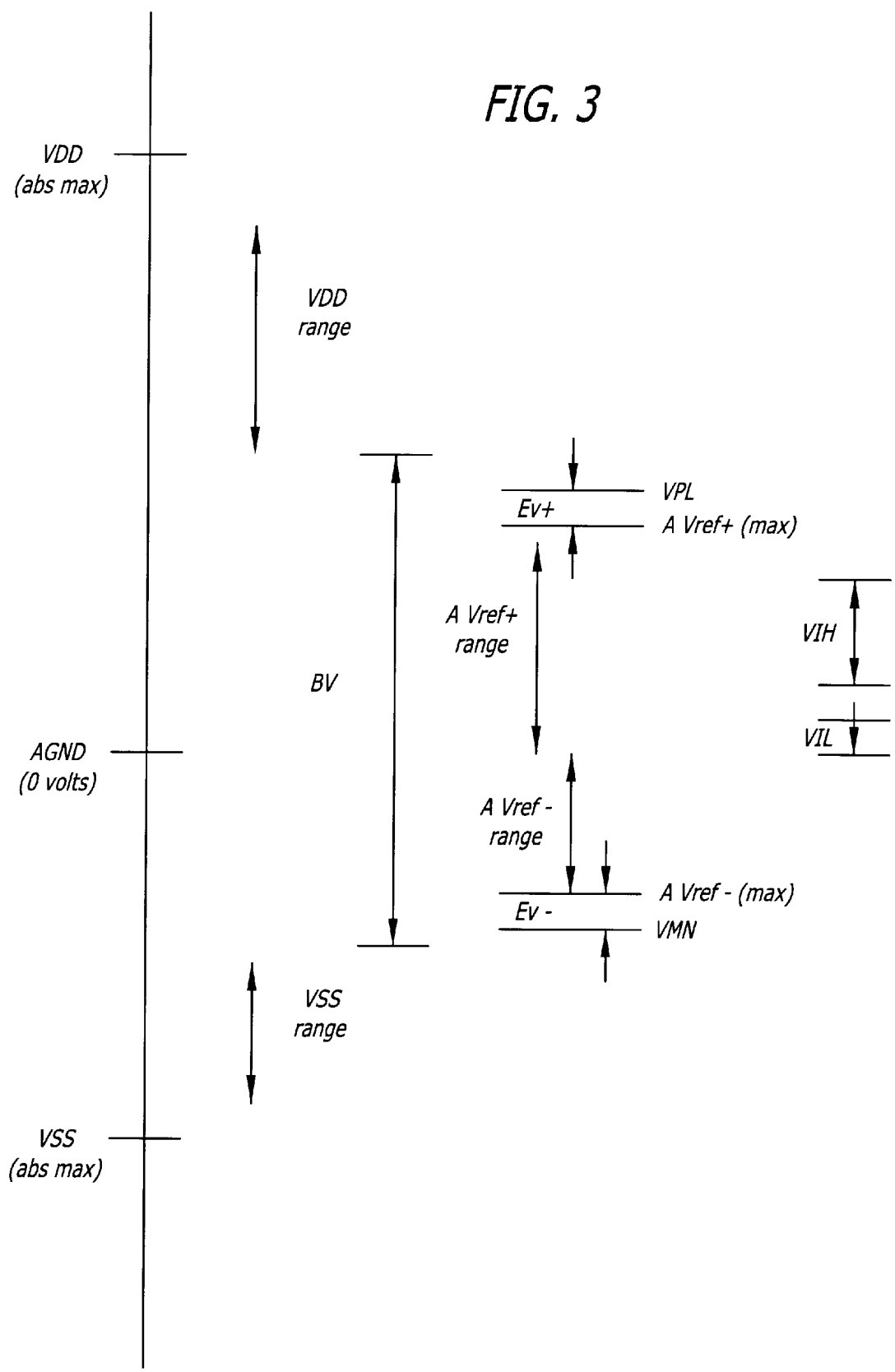

METHOD AND APPARATUS FOR SWITCHING LOW VOLTAGE CMOS SWITCHES IN HIGH VOLTAGE DIGITAL TO ANALOG CONVERTERS

CROSS REFERENCE TO RELATED APPLICATION

This application is related to U.S. patent application Ser. No. 09/305,909, filed May 5, 1999 by inventors FANG et al, entitled "METHOD AND APPARATUS FOR DEGLITCHING DIGITAL TO ANALOG CONVERTERS" and to be assigned to Maxim Integrated Products, Inc. the disclosure of which is hereby incorporated by reference, verbatim and with the same effect as though it were fully and completely set forth herein.

This application is also related to U.S. patent application Ser. No. 09/299,691, filed Apr. 26, 1999 by inventors CASTANEDA et al, entitled "METHOD AND APPARATUS FOR DIGITAL TO ANALOG CONVERTERS WITH IMPROVED SWITCHED R-2R LADDERS" and assigned to Maxim Integrated Products, Inc. the disclosure of which is hereby incorporated by reference, verbatim and with the same effect as though it were fully and completely set forth herein.

FIELD OF THE INVENTION

This invention relates generally to digital to analog converters. More particularly, the invention relates to voltage level translation for controlling switches within digital to analog converters.

BACKGROUND OF THE INVENTION

The functional operation of a digital to analog converter (DAC) is well known. Generally, a DAC accepts a digital input signal and converts it into an analog output signal. The digital input signal has a range of digital codes which are converted into a continuous range of analog signal levels of the analog output signal. DACs are useful to interface digital systems to analog systems. Applications of DACs include video or graphic display drivers, audio systems, digital signal processing, function generators, digital attenuators, precision instruments and data acquisition systems including automated test equipment.

There are a variety of DACs available for converting digital input signals into analog output signals depending upon the desired conversion functionality. The variations in the DACs available may have different predetermined resolutions of a digital input signal, receive different encoded digital input signals, have different ranges of analog output signals using a fixed reference or a multiplied reference, and provide different types of analog output signals. Additionally there are a number of DAC performance factors to consider such as settling time, full scale transition time, accuracy or linearity, and a factor previously mentioned, resolution.

The digital input signal is a number of bits wide that defines the resolution, the number of output levels or quantization levels, and the total number of digital codes that are acceptable. If the digital input signal is m-bits wide, there are $2^m$ output levels and $2^{m-1}$ steps between levels. The digital input signals may be encoded in straight binary, two's complement, offset binary, grey scale code, binary coded decimal or other digital coding. The range of analog output signal values usually depend upon an analog reference. The analog reference may be internally generated but is usually externally provided for precision. The analog output signal range may be proportional to the digital input signal over a fixed analog reference level as in a fixed reference DAC. Alternatively, the analog output signal may be the product of a varying input analog reference level and the digital code of the digital input signal as in multiplying DACs. The analog output signal may be unipolar ranging in either positive values or negative values or it may be bipolar ranging between both positive and negative output values. The analog output signal may be an analog voltage signal or an analog current signal.

Additionally, the type of electronic circuitry used to form a DAC varies as well. Bipolar junction transistor (BJT) technology, metal oxide semiconductor (MOS) technology or a combination thereof are used to construct DACs. BJT technology may be PNP technology with PNP transistors or NPN with NPN transistors or both, while MOS technology may be PMOS with P-channel field effect transistors (PFET), NMOS with N-channel field effect transistors (PFET) or CMOS technology having both PFETs and NFETs. Generally, BJT technology is preferable for constructing precision amplifiers because it has higher transconductance than CMOS technology. This results in lower offset for differential amplifiers. CMOS technology is preferable for constructing switches because it has nearly zero offset when used as a switch. This is so because PFETs and NFETs have virtually no gate current as compared to base current for PNP and NPN transistors of BJT technology. Integrated circuits or wafer fab manufacturing processes combining both BJT and CMOS technology, referred to as BICMOS circuits or processes, are used to provide BJT technology for amplifiers and CMOS technology for switches on the same integrated circuit.

Referring now to FIG. 1, a block diagram of a DAC 100 has a digital input signal DIN 101, a positive analog supply voltage level, AVref+ 104, and a negative analog supply voltage level, AVref– 105, in order to generate an analog voltage output signal, AVout 110. Alternatively DAC 100 can generate an analog current output signal with minor changes to its circuit configuration. To generate either type of analog output, the DAC 100 includes digital and analog power supplies. The digital power supply provided to DAC 100 is input across the positive digital supply terminal, VCC 102, and the negative digital supply terminal, DGND 103. The positive analog power supply provided to DAC 100 is input across the positive analog supply terminal, VDD 106, and the analog ground terminal, AGND 107. The negative analog power supply is input across the negative analog supply terminal, VSS 108, and the analog ground terminal, AGND 107.

For simplicity in discussion consider DAC 100 to be a fixed reference DAC such that the output voltage range of AVout 110 is a function of DIN 101 and the range of voltage is defined by the predetermined voltage levels of AVref+ 104 and AVref– 105. DIN 101 is m bits wide. The predetermined value of m represents the range of decimal numbers that DIN 101 will represent. The selected circuitry for DAC 100 varies depending upon a number of factors including power supply inputs and desired parameters of input and output signals. As illustrated in FIG. 1, DAC 100 includes a signal converter 112 and an amplifier or buffer 114. Some forms of DACs, specifically current output DACs, may not include the buffer 114 and require external amplification. Signal converter 112 converts DIN 101 into a form of analog signal VLADR 120 which is input to buffer 114. Buffer 114 buffers the analog signal VLADR 120 generated by the signal converter 112 from a load that may be coupled to AVout 110.

The signal converter 112 includes a switched R-2R ladder 116 and a switch controller 118. Switch controller 118 controls switches within the switched R-2R ladder 116 to cause it to convert the value of DIN 101 into an analog signal.

As previously discussed, there are a number of DAC performance factors to consider including a DAC's accuracy or linearity. In measuring linearity of a DAC, the analog output AVout 110 from a DAC may be bipolar output voltages, positive unipolar output voltages or negative unipolar output voltages over the range of the digital input signal DIN 101. If a change in an analog voltage reference level is required to establish a zero point or a midpoint of the conversion range, it is referred to as an offset voltage. Differential linearity is the linearity between code transitions measuring the monotonicity of a DAC. If increasing code values of DIN results in increasing values of AVout, the DAC is monotonic, and if not, the DAC has a conversion error and is not monotonic. The linearity of a DAC is very important for accurate conversions and is usually specified in units of least significant bits (LSB) of DIN 101. Linearity of a DAC can vary over temperature, voltages, and from circuit to circuit. Additionally, DAC linearity becomes more important as the predetermined DAC resolution is increased, where the value of m is larger, and additional digital codes are desired to be converted. Furthermore, as the analog voltage reference level range between AVref+ 104 and AVref− 105 may be increased to accommodate additional resolution, it is desirable to maintain linearity in a DAC.

Referring now to FIG. 2, a prior art switched R-2R ladder 116 is illustrated. The switched R-2R ladder 116 is a 4 bit inverted R-2R ladder to provide an analog voltage output signal but may be easily expanded to m-bits with the addition of other intermediate R-2R switch legs and additional switch control lines. Alternatively, a non-inverted R-2R ladder could be used to provide an analog current output signal. Signals DBn/DBp 201, the switch control lines, are selectively controlled by the switch controller 118 in order to generate an analog voltage signal VLADR 120. DBn/DBp 201 switches ON and OFF NFETs 211–214 and PFETs 216–219 in conjunction with NFETs 236–239 in order to change the voltage division of the R-2R resistor network between AVref+ 104 and AVref− 105 and VLADR 120. Inverters 246–249 generate the inverter polarity of the switch control lines D4Bp-D1Bp 241–244 to control the NFETs 236–239 to form fully complementary switches with PFETs 216–219. NFET 211 and PFET 216/NFET 236 represent the most significant bit (MSB) of the DAC and can couple 8/16 of the reference voltage range to VLADR 120. NFET 212 and PFET 217/NFET 237 can couple 4/16 of the reference voltage range to VLADR 120. NFET 213 and PFET 218/NFET 238 can couple 2/16 of the reference voltage range to VLADR 120. NFET 214 and PFET 219/NFET 239 represent the LSB of the DAC and can couple 1/16 of the reference voltage range to VLADR 120. Thus, when the digital code is 1111, PFETs 216–219 and NFETs 236–239 are all ON and NFETs 211–214 are all OFF such that 15/16 of the reference voltage range is coupled to VLADR 120. When the digital code is 0000, NFETs 211–214 are all ON and PFETs 216–219 and NFETs 236–239 are all OFF such that no current flows between AVref+ 104 and AVref− 105 in a resistor and AVref− 105 is coupled to VLADR 120.

The circuit connections of the switched R-2R ladder 116 are now described. NFET 215 has its gate tied to terminal leg gate voltage signal, TLGV 235, such that it is constantly turned ON. The voltage level of TLGV 235 additionally provides switch resistance matching between NFETs and PFETs in the switched R-2R ladder 116. NFETs 211–215 have sources connected to AVref− 105 and drains respectively connected to first ends of resistors 220–224. PFETs 216–219 have sources connected to AVref+ 104 and drains respectively connected to first ends of resistors 220–223. NFETs 236–239 have sources respectively connected to the first ends of resistors 220–224 and drains connected to AVref+ 104. The gates of NFETs 211–214 are respectively connected to signals D4Bn-D1Bn 231–234 and gates of PFETs 216–219 are respectively connected to signals D4Bp-D1Bp 241–244. The inverters 246–249 have inputs respectively coupled to signals D4Bp-D1Bp 241–244 to generate the inverted polarity for coupling their outputs to the gates of NFETs 236–239 respectively. Signals D4Bn-D1Bn 231–234 and signals D4Bp-D1Bp 241–244 are collectively referred to as signals DBn/DBp 201 from switch controller 118. Resistors 220–223 each have a resistance value of 2R. Resistors 224–228 each having a resistance value of R are coupled in series together with a first end of resistor 228 coupled to VLADR 120. A second end of resistor 224 is coupled to a second end of resistor 225 at node 250 while a second end of resistor 220 is coupled to VLADR 120. Resistors 223, 225, and 226 each have an end coupled to node 251. Resistors 222, 226, and 227 each have an end coupled to node 252. Resistors 221, 227, and 228 each have an end coupled to node 253. The MSB leg of the switched R-2R ladder 116 is defined as NFET 211/PFET 216/NFET 236 and resistor 220, the LSB leg as NFET 214/PFET 219/NFET 239 and resistors 223 and 226, and the termination leg as NFET 215 and resistors 224–225. The intermediate legs of the switched R-2R ladder 116 are NFET 213/PFET 218/NFET238 and resistors 222 and 227 and NFET 212/PFET 217/NFET237 and resistors 221 and 228.

The PFET and NFET switches are binarilly weighted from LSB to MSB to adjust for differences in IDS drain to source current flow and maintain similar VDS voltage drops across drain to source. For example, if NFET 214/PFET 219/NFET 239 switches are weighted 1×, NFET 213/PFET 218/NFET 238 switches are weighted 2×, NFET 212/PFET 217/NFET 237 switches are weighted 8×, and NFET 211/PFET 216/NFET 236 switches are weighted 16× in transistor size to reduce the RON of the transistors. This reduces user trimming for a drift that would otherwise be introduced by mismatched RON resistances when the transistor switches are turned ON and OFF.

As previously discussed, linearity of DAC 100 is important to accurately convert DIN 101 to AVout 110. In switching voltages in the switched R-2R ladder 116, PFETs 216–219, NFETs 236–239, and NFETs 211–215 are switched ON to operate in their linear region where drain to source voltage, VDS, is equivalent to drain to source current times the ON resistance of the transistor. VDS≈IDS×RON. The drain to source voltage and drain to source current vary such that the ON resistance, RON, of the transistor may remain somewhat constant. However, if the drain to source voltage, VDS, of the PFET or NFET switches reaches higher levels, saturation first occurs and then breakdown. Saturation and breakdown are both nonlinear effects which are undesirable operating characteristics for the PFET and NFET switches. In saturation the resistance of the transistor varies up until a drain to source breakdown voltage is reached. In breakdown of a MOSFET, little change in drain to source voltage causes substantial increases in the drain to source current. In breakdown, NFET and PFET device resistance is very small and substantial damage may occur if the drain to source current is not limited. MOSFET transistor breakdown may also occur because excessive gate to source voltage, VGS, is applied across the gate and source of an NFET or PFET.

In order to increase breakdown voltages, alternate transistor technology may be used or alternate transistor manufacturing topology may be used. However, the trend in wafer manufacturing of transistors is to construct smaller devices to lower costs and increase margins for a given integrated circuit. Techniques to increase breakdown voltages usually result in undesirable side-effects increasing manufacturing costs such as increasing device sizes. It is desirable to use circuitry to avoid excessive gate to source voltage, VGS, and drain to source voltage, VDS, being applied to NFET and PFET switches of a DAC which might otherwise cause breakdown. While diode clamp circuitry may be used to avoid excessive gate to source voltages, this is not practical in a DAC because of the requirements of linearity. If diodes clamp the voltage applied to gates of the switches in the switched R-2R ladder, resistance mismatching and nonlinearities would result when clamping would occur.

High voltage DACs are desirable to accommodate increased resolution while lower manufacturing costs are maintained by use of smaller devices with lower breakdown voltages. In higher voltage DAC's, the DAC power supply range is larger and the analog voltage reference level range between AVref+ 104 and AVref- 105 may be increased to support the higher resolution and maintain substantial linearity in DACs. Also, in certain applications, such as automated test equipment (ATE), it is desirable to vary the AVref+ 104 and AVref- 105 analog voltage reference levels to provide differing DAC analog output levels. In order to accommodate the varying levels of analog voltage reference levels, DAC power supply voltages may need to vary over a range as well. The high voltage levels and variability in analog voltage reference levels increase the potential for breakdown of MOSFET transistors including the PFET and NFET switches of the R-2R ladder 116. Higher gate to source voltage, VGS, and drain to source voltage, VDS, may be placed upon a given MOSFET transistor in high voltage DACs if steps are not taken to alleviate these conditions.

Additionally, the digital input signal DIN 101 provided to DAC 100 may be TTL logic levels, CMOS logic levels or their low voltage equivalents such as LVTTL or LVCMOS. In the operation of high voltage DACs, it is desirable to convert the voltage levels received for a digital input signal DIN 101 into proper internal voltage levels for operation of the DAC 100 without breakdown. Because it is desirable to provide variable analog voltage reference levels which leads to varying power supply levels, the problem of providing level translation for proper operation of the DAC 100 is increased. It is desirable to provide level translation within high voltage DACs such that varying analog voltage reference levels and power supply levels are accommodated and proper linear operation is achieved without MOSFET transistor breakdown.

BRIEF SUMMARY OF THE INVENTION

Briefly, the present invention includes a method, apparatus and system for switching low voltage CMOS switches in high voltage digital to analog converters as described in the claims. An improved switch controller is provided to improve a digital to analog converter (DAC) having a higher range of power supply inputs to accommodate a wide range of analog reference voltages and analog output voltages. The present invention allows for a wide range of power supply voltages to be supplied to the DAC that meets or exceeds the breakdown voltage of CMOS switches used to control and switch reference voltages within a switched R-2R ladder of the DAC. It further allows for the analog voltage output swing to meet or exceed the breakdown voltage of CMOS switches. Because the present invention avoids applying the high voltage levels of the power supplies to the control logic and the switch control terminals in controlling the switching of the switches to generate the analog output signal, CMOS transistors may be used as switches in the R-2R ladder having low CMOS breakdown voltages. Furthermore, a wide range of power supplies (VDD, VSS) and analog reference voltages (AVref+, AVref-) may be utilized while linearity and functional performance of the DAC is retained.

From positive and negative power supplies, positive and negative generated voltages (VPL and VMN) are generated which are fixed voltage levels. The positive and negative generated voltages are the OFF voltage levels for switches within the switched R-2R ladder. The difference between the voltage levels of the positive and negative generated voltages is less than the breakdown voltage of the switches. Formulas for determining the fixed voltage levels are disclosed to design for various ranges of analog reference voltages and breakdown voltages.

A TTL/CMOS input receiver receives the digital input signal and translates it into CMOS logic levels. The digital input signal is level shifted from the CMOS logic levels to logic levels having positive and negative generated voltage levels to properly turn ON and OFF switches in the switched R-2R ladder.

A circuit matches the switch resistance of the switches switching the positive and negative analog reference input voltages (AVref+ and AVref-). The circuit forms the positive and negative ON voltages for the respective switches from the positive and negative analog reference input voltages.

Switch drivers receive the ON voltage levels, the OFF voltage levels and a digital input signal having logic levels of the positive and negative generated voltage levels. The switch drivers appropriately couple these voltage levels to the control terminals of the switches within the switched R-2R ladder for proper switch operation (switch resistance matching ON voltage levels and proper OFF voltage levels) without exceeding the breakdown voltage of the switches. The switch drivers additionally provide for break before make timing between switches coupling the positive and negative analog reference voltages in the R-2R ladder.

BRIEF DESCRIPTIONS OF THE DRAWINGS

FIG. 3 is a chart of voltage ranges the present invention operates over and generates in order to assure proper operation.

Like reference numbers and designations in the drawings indicate like elements providing similar functionality.

DETAILED DESCRIPTION OF THE PREFERRED EMBODIMENT

Figure 1:
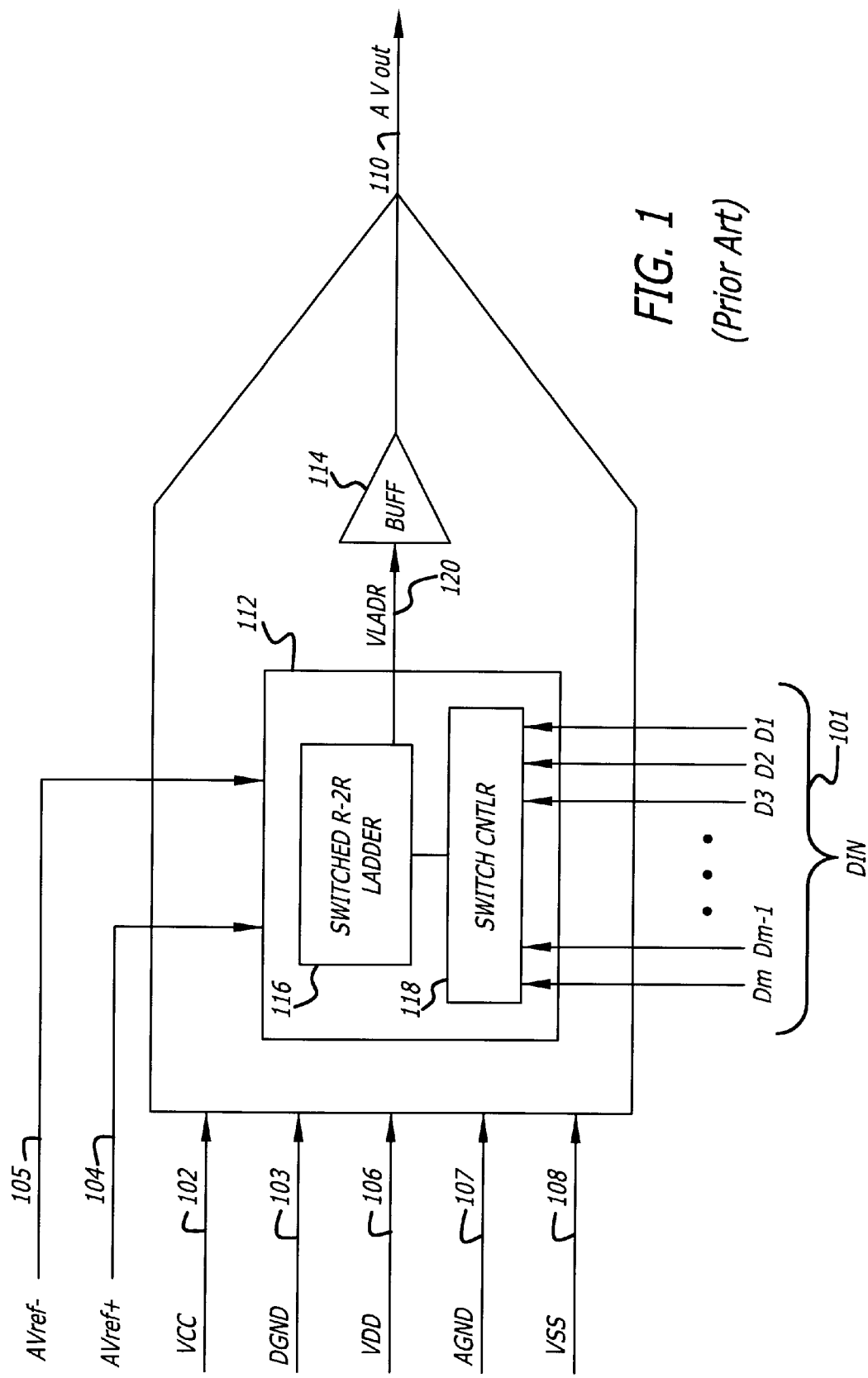
FIG. 1 is a block diagram of a prior art digital to analog converter.

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail so as not to unnecessarily obscure aspects of the present invention.

The present invention includes a method, apparatus and system for switching low voltage CMOS switches in high voltage digital to analog converters. Briefly, an improved switch controller is provided to improve a digital to analog converter (DAC) for allowing a wide range of positive (VDD) and negative (VSS) power supply and a wide range of positive (AVref+) and negative (AVref−) analog reference voltages. Additionally, a wide range of analog output voltages (AVOUT) can be accommodated and a wide range (VDDmax−VSSmin) of power supply voltages can be supplied to the DAC without breakdown of CMOS switches. In the present invention, the range of power supply voltages can exceed the breakdown voltage of CMOS switches within the DAC. The present invention further allows for the range of the analog output voltages to exceed the breakdown voltage of the CMOS switches in the R-2R ladder. Because the present invention avoids directly applying power supply voltage levels (VDD and VSS) exceeding CMOS breakdown voltages to the switch control circuitry and the switches, CMOS transistors with CMOS breakdown voltages less than the range (VDD–VSS) of the power supply voltages may be used.

From positive and negative power supplies, positive and negative generated voltages (VPL and VMN) are generated having fixed voltage levels with a voltage difference less than the CMOS breakdown voltages. The positive and negative generated voltages provide OFF voltage levels for CMOS switches within the switched R-2R ladder while preventing CMOS transistors from reaching high voltage breakdown. The OFF voltage levels are sufficient to completely turn OFF switches in the R-2R ladder without exceeding the CMOS breakdown voltages. Design formulae for the positive and negative generated voltages are disclosed.

A TTL/CMOS input receiver receives the digital input signal and translates it into CMOS logic levels. The digital input signal is level shifted from the CMOS logic levels to logic levels having positive and negative generated voltage levels to properly turn ON and OFF switches in the switched R-2R ladder.

A resistance matching circuit matches the switch resistance of switches in the R-2R ladder. The circuit also generates the positive and negative ON voltage levels for the respective switches in the R-2R ladder.

Switch drivers couple the ON voltage levels and the OFF voltage levels to the control terminals of the switches within the switched R-2R ladder in response to the digital input signal. The switch drivers additionally provide for break before make timing control.

Referring now to FIG. 3, a chart of voltage ranges around the digital to analog converter of the present invention are illustrated. The positive analog supply, VDD, has an operational range, VDD range, and an absolute maximum level, VDD (abs max). In the preferred embodiment, the VDD range is from seven volts to fourteen volts with a VDD (abs max) of seventeen volts. The negative analog supply, VSS, has an operation range, VSS range, and an absolute minimum level, VSS (abs min). The positive power supply and negative power supply are not to be set above or below VDD (abs max) and VSS (abs max) respectively. In the preferred embodiment, the VSS range is from negative five volts to negative nine volts with a VSS (abs min) of negative eleven volts.

VDD and VSS may be set to voltage levels such that the range between them exceeds CMOS switch breakdown voltages, BVCMOS. While it is preferable to have a higher switch breakdown voltage, BV, the preferred embodiment of the present invention uses PFET and NFET switches manufactured with gate to source and drain to source breakdown voltages (BVCMOS) less than the range between VDD and VSS. Whichever of the gate to source or drain to source breakdown voltages is less, sets the switch breakdown voltage BV. In the preferred embodiment of the present invention, the gate to source and drain to source breakdown voltages are equivalent values such that BV is twelve volts.

The positive and negative analog reference voltages may also be set to different levels over a range of values. In the preferred embodiment, the positive analog reference voltage is set within the AVref+ range of values between zero volts and six volts. In the preferred embodiment, the negative analog reference voltage is set within the AVref− range of values between negative four and zero volts. The maximum voltage range between AVref+ and AVref− is not to exceed the value of the switch breakdown voltage, BV. In the preferred embodiment, the maximum range between positive and negative analog reference voltages settings is two volts less than the switch breakdown voltage, BV. In the present invention, BVCMOS is preferably twelve volts and the maximum range between AVref+ and AVref− is ten volts.

Additionally, the digital input signal, DIN 101, may have different digital input signal levels for logic high and logic low. The digital input signal levels may be TTL, CMOS or their low voltage equivalents. With respect to TTL and CMOS digital input levels, the voltage levels for a logic high input may vary over the range from a low of two volts to a high of the positive digital supply level. The voltage levels for a logic low input may vary from a high of 0.8 volts to a low of the negative digital supply level. The positive digital supply level in the preferred embodiment is five volts while the negative digital supply level in the preferred embodiment is ground or zero volts.

VPL and VMN are fixed positive and negative generated voltages respectively. The positive generated voltage VPL is greater than the positive analog reference voltage AVref+ by an incremental positive ensurance voltage Ev+. The negative generated voltage VMN is less than the negative analog reference voltage AVref− by an incremental negative ensurance voltage Ev−. The voltage difference between the positive generated voltage VPL and the negative generated voltage VMN is less than the switch breakdown voltage, BV, but greater than the maximum voltage difference between positive and negative analog reference voltages, AVref+ and AVref−. Additionally, the midpoint or center voltage level of the range between VPL and VMN is preferably the same midpoint of AVref+ (max) and AVref− (min). The ensurance voltages Ev+ and Ev− are for ensuring switch turn OFF. In the preferred embodiment, VPL and VMN are fixed voltage levels of positive six and one-half volts and negative four and one-half volts respectively. In the preferred embodiment, the midpoint for VPL and VMN and for AVref+ (max) and AVref− (min) is one volt. In the preferred embodiment, Ev+ and Ev− are positive one-half volt and negative one-half volt respectively but may be reduced to as little as zero. In the preferred embodiment, AVref+ (max) is six volts and AVref− (min) is negative four volts.

In general, the following design equations may be used to determine the proper level for VPL and VMN given the design constraints of the DAC. Assuming the present invention is employed, it is desirable to provide a wider range of output voltages on AVOUT 110 exceeding the range of voltages on VLADR 120. Thus, a gain can be used to provide the wider range on AVOUT 110 for a given voltage range on VLADR 120 such that, low voltage CMOS transistor switches may be utilized in the R-2R ladder. We can determine the appropriate amount of gain for an amplifier circuit as follows:

$\Delta V_{OUT}$=Voltage Swing of Output Buffer Amplifier
$\Delta V_{DAC}$=Voltage Swing of R-2R DAC
$BV_{CMOS}$=Breakdown Voltage of CMOS transistors $$BV_{CMOS} > \frac{V_{OUT}(\text{max}) - V_{OUT}(\text{min})}{A_V}$$

Then, the gain of the output amplifier circuit, $A_V$, is limited by:

$$A_V > \frac{V_{OUT}(\text{max}) - V_{OUT}(\text{min})}{BV_{CMOS}}$$

The values for the fixed positive and negative generated voltages ($V_{PL}$ and $V_{MN}$) can also be determined. First, the fixed positive and negative generated voltages ($V_{PL}$ and $V_{MN}$) are constrained by BVCMOS as follows:

$$V_{PL}-V_{MN} < BV_{CMOS}$$

or $$V_{PL}-V_{MN}=BV_{CMOS}-2*E_V$$

(where $E_{V+}$ and $E_{V-}$ are equal to $E_V$ and $2*E_V$ is the design margin for ($V_{PL}$ and $V_{MN}$) constrained by $BV_{CMOS}$)

The analog reference voltage range ($AV_{REF+}$(max) $-AV_{REF-}$(min)) is also constrained by $BV_{CMOS}$ where:

$$V_{REF+}(\text{max})-V_{REF-}(\text{min}) \leq V_{PL}-V_{MN}=BV_{CMOS}-2*E_V$$

Thus, the fixed positive and negative generated voltages ($V_{PL}$ and $V_{MN}$) can be determined as follows:

$$\frac{V_{PL}+V_{MN}}{2} = \frac{V_{REF+}(\text{max})+V_{REF-}(\text{min})}{2} = \text{mid-point}$$

$$V_{PL} = \frac{V_{REF+}(\text{max})+V_{REF-}(\text{min})}{2} + \frac{BV_{CMOS}-2*E_V}{2}$$

$$V_{MN} = \frac{V_{REF+}(\text{max})+V_{REF-}(\text{min})}{2} - \frac{BV_{CMOS}-2*E_V}{2}$$

FIG. 3 and the preceding formulas for variables associated with the present invention may be used for providing voltage levels for other DACs or switching systems for given switch breakdown voltages, desirable power supply levels, and analog reference voltage ranges.

Figure 4A:
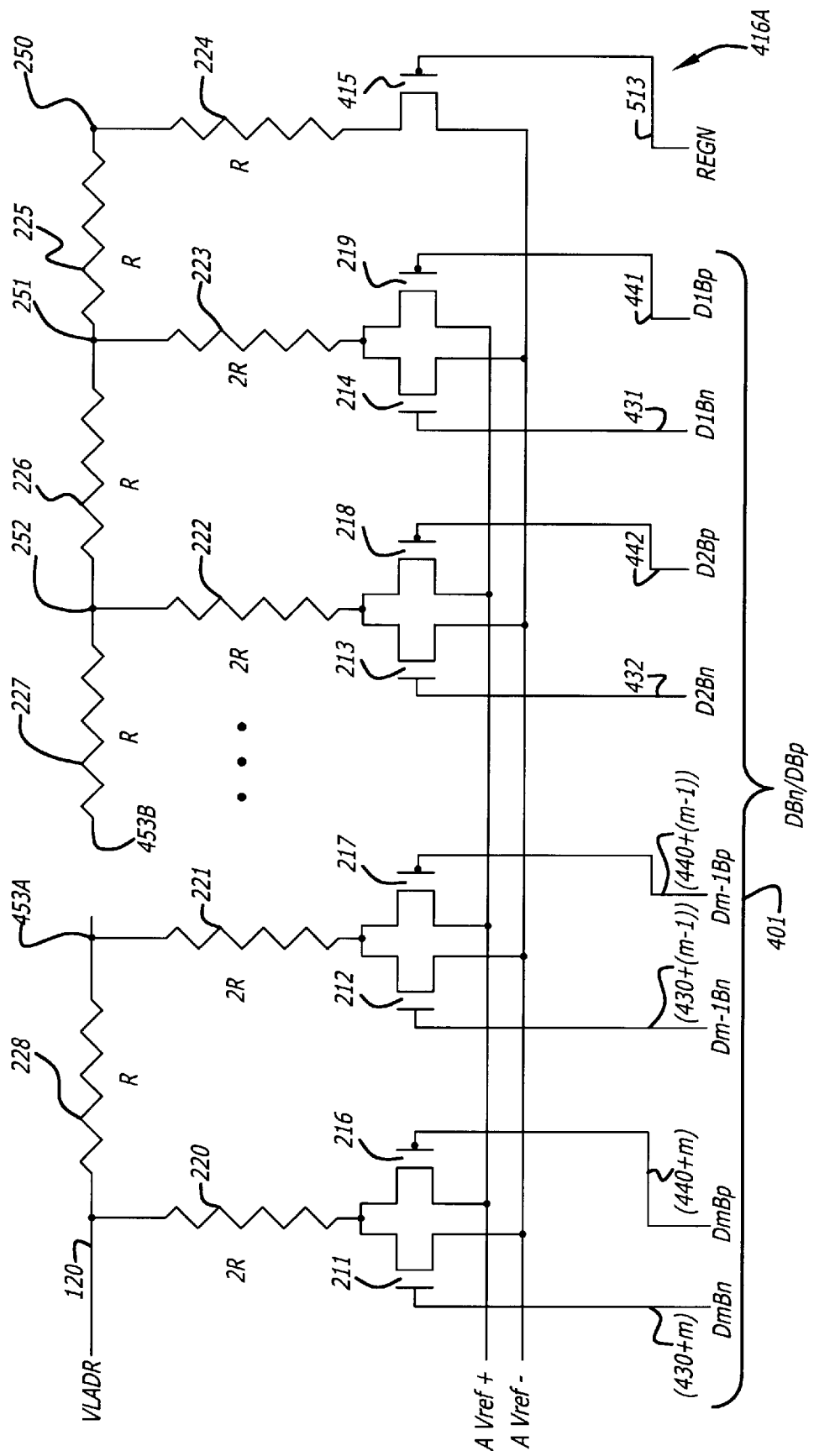
FIG. 4A is a first schematic diagram of an m-bit switched R-2R ladder inverted to provide an analog voltage output for the present invention.
Figure 4B:
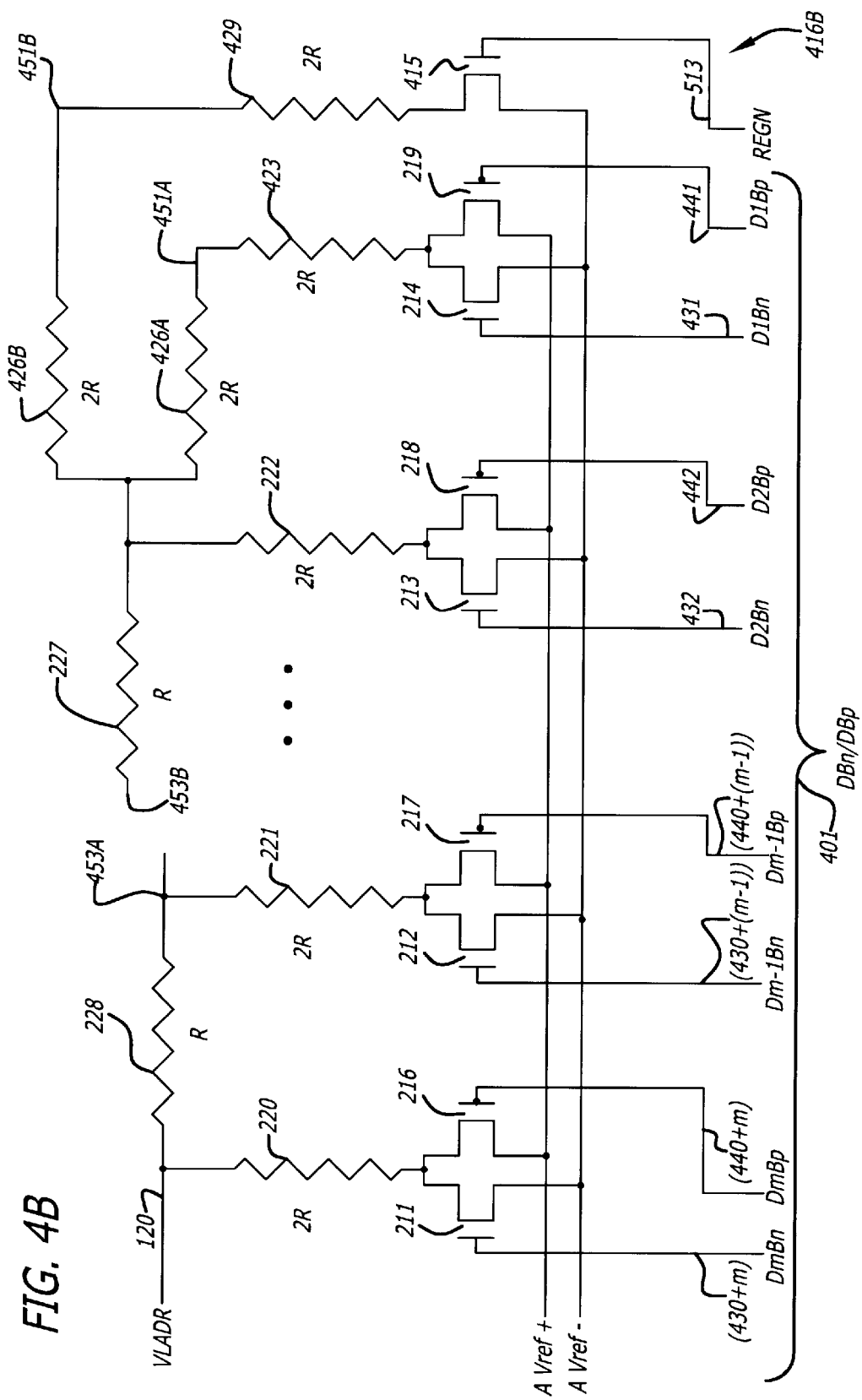
FIG. 4B is a second schematic diagram of an m-bit switched R-2R ladder inverted to provide an analog voltage output for the present invention.

Referring now to FIGS. 4A–4B, m-bit switched R-2R ladders 416A and 416B of the present invention are illustrated. FIGS. 4A–4B illustrate how to expand the 4 bit switched R-2R ladder of FIG. 2 into m-bits. Additionally, FIGS. 4A–4B have NFETs 236–239 and inverters 246–249 eliminated when compared with FIG. 2. NFETs 236–239 were eliminated in order to provide a constant turn ON resistance (RON) for the PFET switches switching AVref+ 104. In the present invention, the RON of the PFET switches is substantially constant and independent from variations in AVref+. In order to avoid transistor breakdown in the PFETs of the switch drivers 508, one clamps REGN to a maximum level of VPL. As a result of clamping REGN to VPL, the gate to source breakdown of the PFETs is avoided when the gate of the PFETs is coupled to VMN. However, clamping REGN to VPL limits the range of the gate to source voltage range for the NFET switches in the R-2R ladder switching AVref−. Providing the PFETs with constant RON limits the necessary range of gate to source voltage for the NFET switches in order to match the RON of the PFETS.

Comparison between FIG. 4A and FIG. 4B indicates that the circuitry of the termination leg and LSB leg of the R-2R ladder 416B has been modified to avoid transistor saturation of NFETs 214 and 415 and assure linearity. This is accomplished by doubling the resistance of the resistors in the LSB leg and termination leg which lowers the voltage drop across the drain and source of the NFETs 214 and 415. To achieve linearity in a DAC, CMOS switches in the switched R-2R ladder are required to operate in their linear region. In cases where the CMOS breakdown voltage is rather low, the switched R-2R ladder 416B is preferable over 416A for maintaining linearity. In these cases, the transistor gate to source breakdown voltage (BVGS) sets a maximum VDSAT by the equation VDSAT(max)=$BV_{GS}-V_T$, where $V_T$ is the threshold voltage of the transistor. A lower breakdown voltage further limits VDSAT and as a result it is more likely that the LSB switch and the termination switch could go into saturation. For a higher resolution DACs the LSB switch and the termination switch may have ON resistances comparable to the unit resistance R of the switched R-2R ladder. As a result, the voltage drop across the switch may be significant when compared to VDSAT, and potentially cause the switch to go into saturation. If relatively low breakdown voltage switches are used in higher resolution DACs, the switched R-2R ladder 416B of FIG. 4B is preferable. In comparing the switched R-2R ladders 416A and 416B of FIGS. 4A–4B with ladder 216 of FIG. 2, NFET 415 differs from NFET 215 in that its gate is tied to a REGN signal 513, described below.

Figure 2:
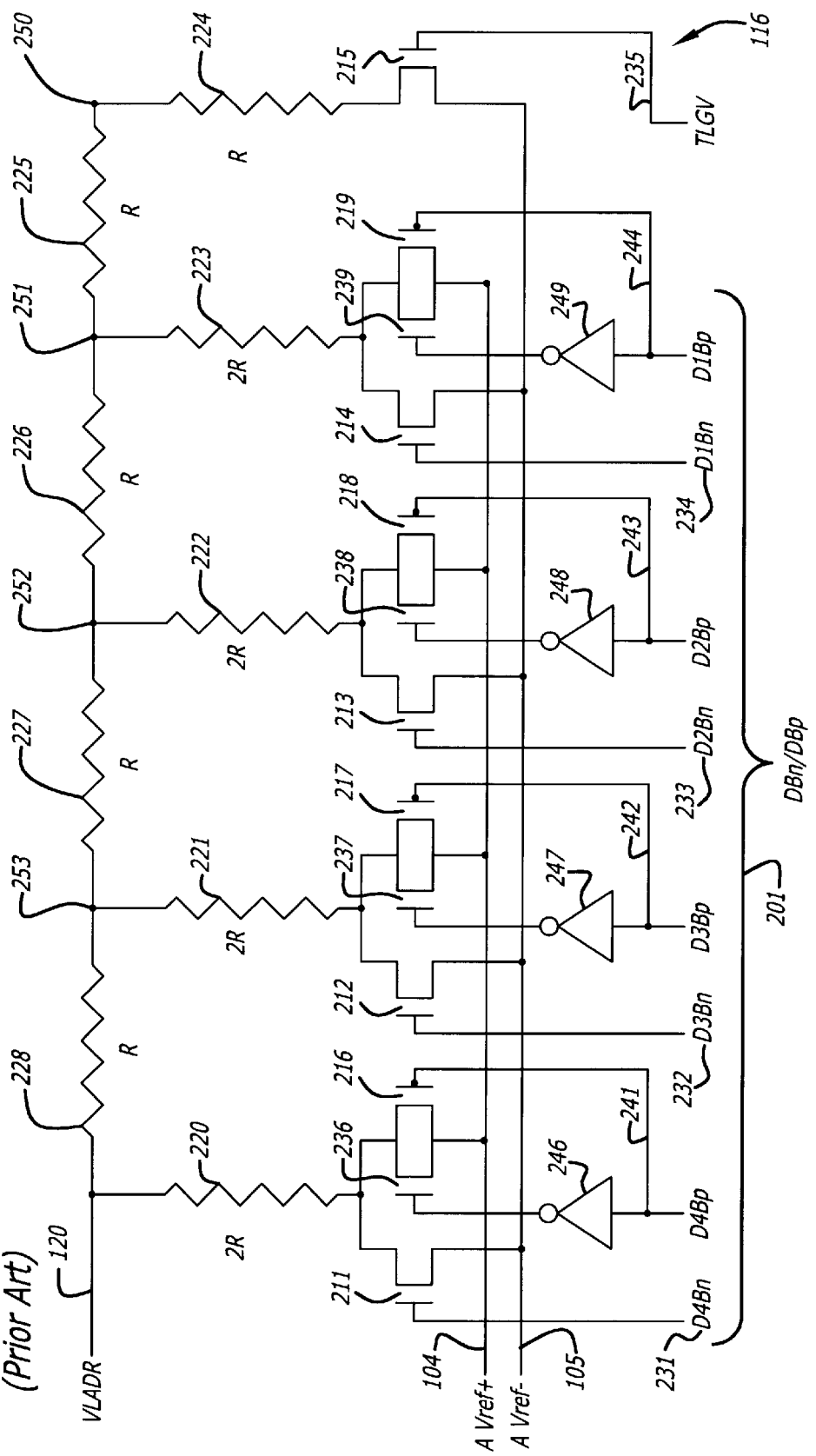
FIG. 2 is a schematic diagram of a prior art 4-bit switched R-2R ladder inverted to provide an analog voltage output.

Regarding the expansion of the switched R-2R ladder to m-bits, node 253 of FIG. 2 is split into two nodes numbered 453A and 453B in FIGS. 4A–4B. The desired number of legs, excluding the termination leg, are then expanded to total to m. The additional circuitry required to add additional intermediate legs is circuitry similar to the intermediate leg of NFET 213/PFET 208 in series with resistor 222 and resistor 227. Additional signals are added to DBn/DBp 201 including signals D1Bn 431 to DmBn (430+m) and D1Bp 441 to DmBp (440+m).

The switched R-2R ladder 416A and 416B are m-bit inverted R-2R ladders to provide an analog voltage output signal. Alternatively, a non-inverted R-2R ladder could be used to provide an analog current output signal. Signals DBn/DBp 401 are selectively controlled by the switch controller 118 in order to generate an analog voltage output signal VLADR 120. DBn/DBp 401 switches ON and OFF NFETs 211–214 and PFETs 216–219 in each m-bit leg in order to change the voltage division of the R-2R resistor network between AVref+ 104 and AVref– 105 and VLADR 120. NFET 211 and PFET 216 represent the MSB of the DAC and can couple $2^{m-1}/2^m$ of the reference voltage range to VLADR 120. The intermediate bit represented by NFET 212 and PFET 217 can couple $2^{m-2}/2^m$ of the reference voltage range to VLADR 120. The intermediate bit represented by NFET 213 and PFET 218 can couple $2/2^m$ of the reference voltage range to VLADR 120. NFET 214 and PFET 219 represent the LSB of the DAC and can couple $\frac{1}{2}^m$ of the reference voltage range to VLADR 120. The analog voltage level on VLADR 120 represents a summation of the coupling of these fractions of reference voltage range. Thus, when the digital code is 111 . . . 111, PFETs 216–219 are all ON and NFETs 211–214 are all OFF such that $(2^m-1)/2^m$ of the reference voltage range is coupled to VLADR 120. When the digital code is 000 . . . 000, NFETs 211–214 are all ON and PFETs 216–219 are all OFF such that no current flows between AVref+ 104 and AVref– 105 in a resistor and AVref– 105 is coupled to VLADR 120. If accommodations can be made in the layout of the resistors of the switched R-2R ladder 416B of FIG. 4B, then resistors 423 and 426A may be lumped together as one resistor and resistors 429 and 426B may be lumped together as one resistor.

Figure 5:
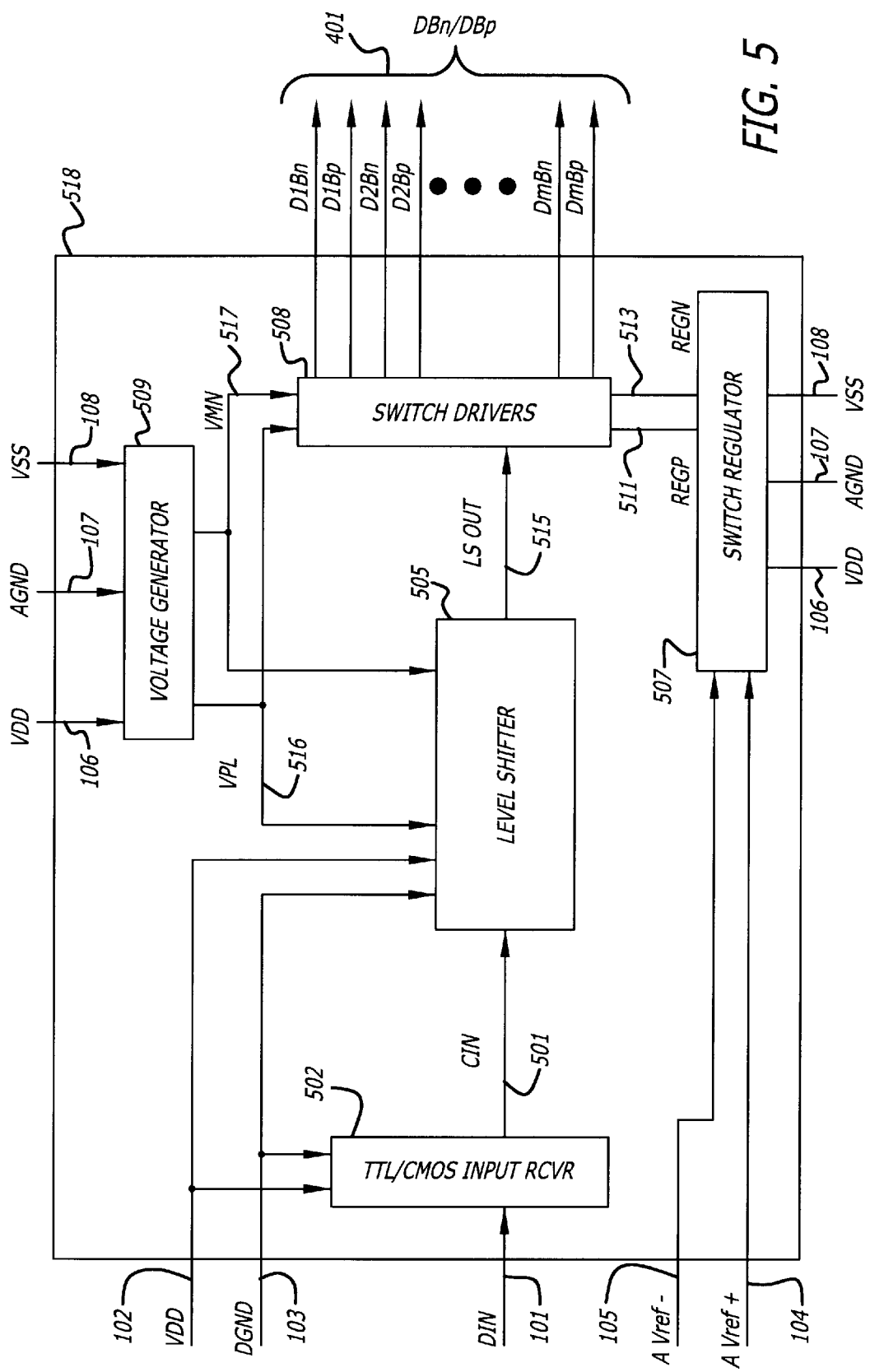
FIG. 5 is a block diagram of the switch controller of the present invention.

Referring now to FIG. 5, a block diagram of the switch controller 518 is illustrated. Switch controller 518 receives input signals DIN 101 to generate the switch control signals DBn/DBp 401. DBn switch control signals, D1Bn 431 through DmBn (430+m), control the NFETs of the switched R-2R ladder 416. DBp switch control signals, D1Bp 441 through DmBp (440+m), control the PFETs of the switched R-2R ladder 416. The control signals DBn/DBp 401 are the break before make timing control signals for the switched R-2R ladder 416 to avoid crow bar currents between AVref+ and AVref– due to PFET and NFET switches being simultaneously ON within a leg. Additionally, the voltage levels of the switch control signals, DBn/DBp 401, to drive the switch control terminals or gates of the PFET and NFET switches, are of sufficient levels to properly switch the switches and avoid switch breakdown.

The switch controller 518 includes a TTL/CMOS input receiver 502, a level shifter 505, and switch drivers 508. The switch controller 518 further includes a switch regulator 507 and a voltage generator 509. The TTL/CMOS input receiver 502 receives digital input codes in either TTL or CMOS voltage levels on DIN 101 and converts them to CMOS levels on CIN 501. CIN 501 is coupled into the level shifter 505.

The switch regulator 507 receives the positive analog reference voltage AVref+ 104 and the negative analog reference voltage AVref– 105 and the analog power supplies and generates a resistance matched P reference, REGP 511, and a resistance matched N reference, REGN 513. REGP 511 and REGN 513 are formed from the analog reference voltage. REGP 511 and REGN 513 are the turn ON voltage levels for the PFET and NFET switches respectively of the switched R-2R ladder 416. REGP 511 is preferably a fixed voltage with respect to AVref+ such that AVref+–REGP is a fixed value. The fixed value is preferably six volts in the preferred embodiment. REGN 513 is a regulated gate voltage level for NFET switches in the R-2R ladder. A servo control loop in the switch regulator 507 regulates the voltage level of REGN such that RON(NFET)=RON(PFET).

The voltage generator 509 receives the analog power supplies from VDD 106, AGND 107, and VSS 108 and generates the fixed positive generated voltage, VPL 516, and the fixed negative generated voltage, VMN 517. VPL and VMN were previously discussed in reference to FIG. 3. VPL 516 and VMN 517 are the turn OFF voltage levels for the PFET and NFET switches respectively of the switched R-2R ladder 416 to assure proper switch operation and avoid the switch breakdown voltage, BV.

The level shifter 505 receives a form of the digital input signal as CIN 501 and VPL 516 and VMN 517 to shift the CMOS digital logic levels of CIN 501 to logic levels having VPL 516 and VMN 517 voltage levels respectively on the level shifter output LSOUT 515. The voltage levels of VPL 516 and VMN 517 provided on LSOUT 515 can properly control the switch drivers 508.

Switch drivers 508 buffer the level shifted signal LSOUT 515 from capacitive loads (particularly the gate to source capacitance of the PFET and NFET switches of the switched R-2R ladder) associated with the switch control lines DBn/DBp 401. Additionally, switch drivers 508 receive VPL 516 and VMN 517 from the voltage generator 509 and REGP 511 and REGN 513 from the switch regulator 507 to drive the switches in the switched R-2R ladder 116 to appropriate turn ON and OFF levels for proper switching operation and avoidance of switch breakdown. Although other circuitry may used, switch drivers 508 also perform the break before make timing control for the switch control signals. Proper break before make timing is required to control the switching of the NFET and PFET switches of the switch R-2R ladder 416 to avoid crowbar currents between AVref+ and AVref–.

Figure 6:
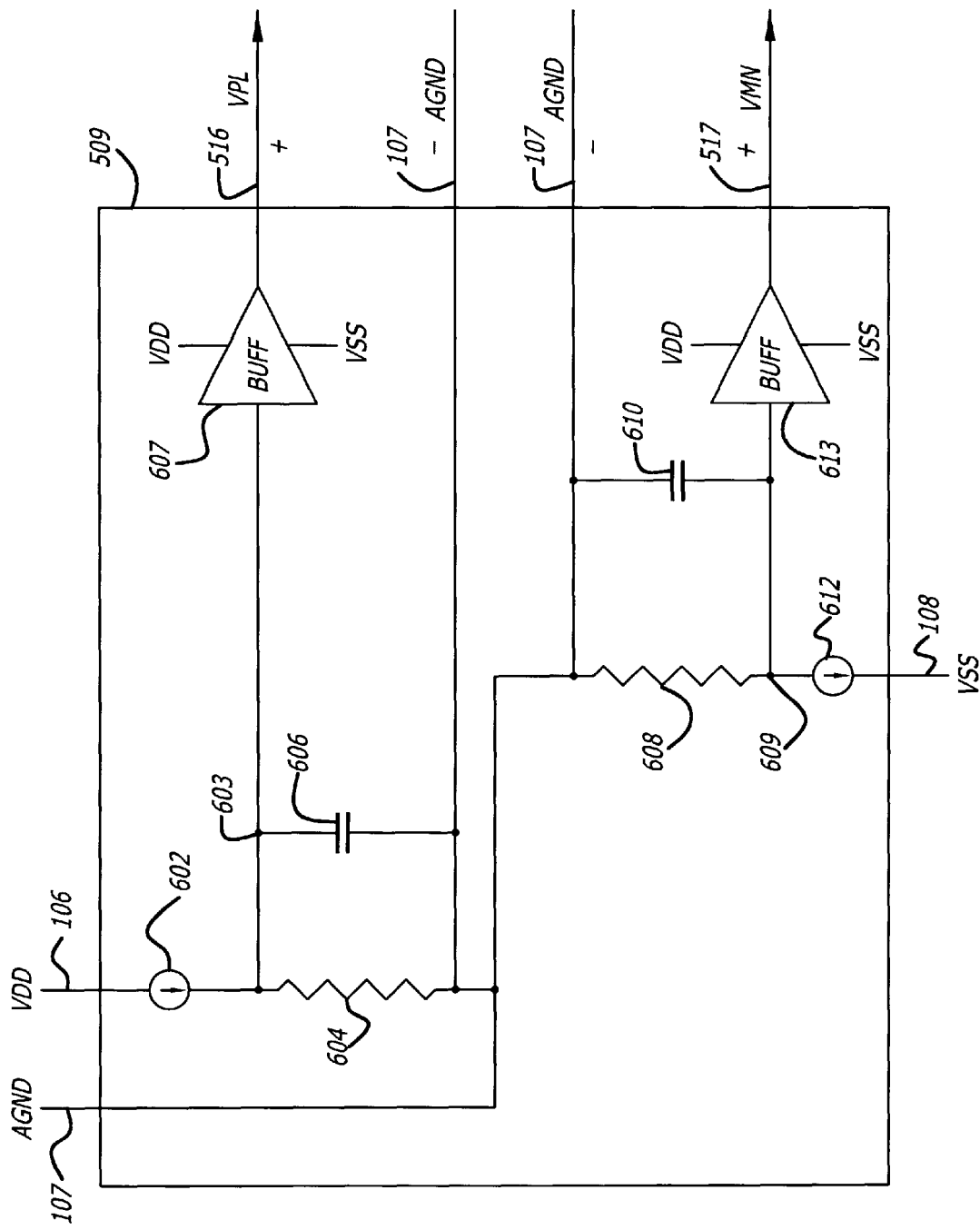
FIG. 6 is a schematic diagram of the voltage generator of the present invention.

Referring now to FIG. 6, a schematic diagram of the voltage generator 509 is illustrated. The voltage generator 509 includes current source 602, resistor 604, capacitor 606, and buffer 607 to generate the fixed positive generated voltage VPL 516. Voltage generator 509 includes resistor 608, capacitor 610, current source 612 and buffer 613 to generate the fixed negative generated voltage VMN 517. Current sources 602 and 612 are constant current sources regardless of variations in the operating range of voltage levels for the positive analog supply voltage VDD 106 and the negative analog supply voltage VSS 108. Resistors 604 and 608 have resistances of approximately three hundred kilo-ohms each. Capacitors 606 and 610 have a capacitance of approximately one picofarad each. Current source 602 is coupled in series with resistor 604 while capacitor 606 is coupled in parallel with resistor 604. Current source 612 is coupled in series with resistor 608 while capacitor 610 is coupled in parallel with resistor 608.

The current from current source 602 flows into the resistor 604 at node 603 in order to generate a positive voltage across nodes 603 and AGND 107. Current from current source 612 flows out of resistor 608 at node 609 into the current source 612 and into VSS 108 to generate a negative voltage across nodes 609 and AGND 107. Buffers 607 and 613 buffer and drive the voltages from nodes 603 and 609 onto VPL 516 and VMN 517 respectively and any associated loads. Buffers 607 and 613 maintain a substantially fixed voltage level equivalent to the voltage on nodes 603 and 609 respectively. Current sources 602 and 612 are constructed using well known BJT current source circuitry.

Figure 7:
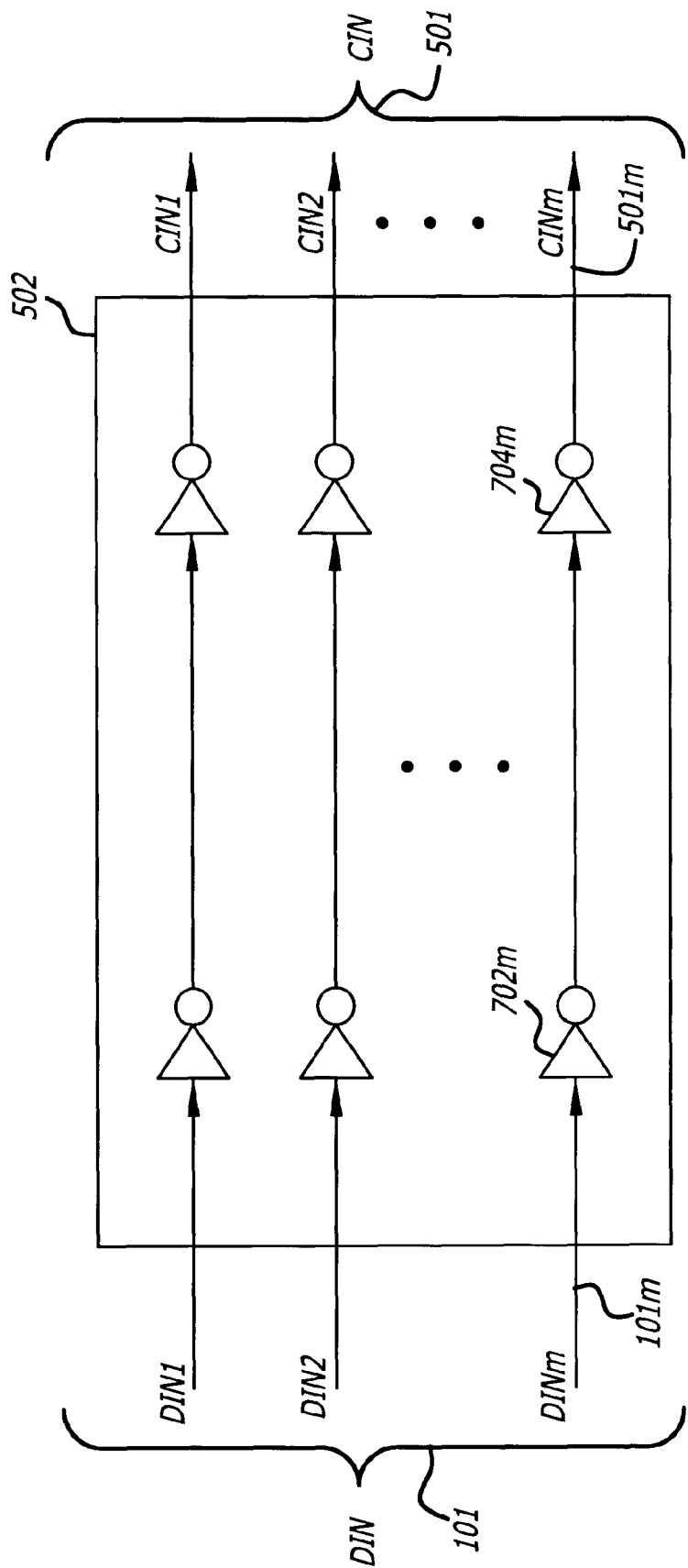
FIG. 7 is an exemplary schematic diagram of a TTL/CMOS input receiver for the present invention.

Referring now to FIG. 7, a schematic diagram of an exemplary TTL/CMOS input receiver 502 is illustrated. TTL (transistor-transistor logic), CMOS (complementary metal oxide semiconductor), or other digital input levels may be supplied to input DIN 101 of the DAC. The TTL/CMOS input receiver 502 converts these input levels to CMOS voltage levels on output CIN 501. An inversion from DIN 101 to the switch control signals on the control terminals needs to occur in order to have proper code polarity for straight binary coding. Inverter 702m has its PFET and NFET ratioed to have an input switch point midway between TTL levels which is also satisfactory for receiving CMOS levels.

Figure 8:
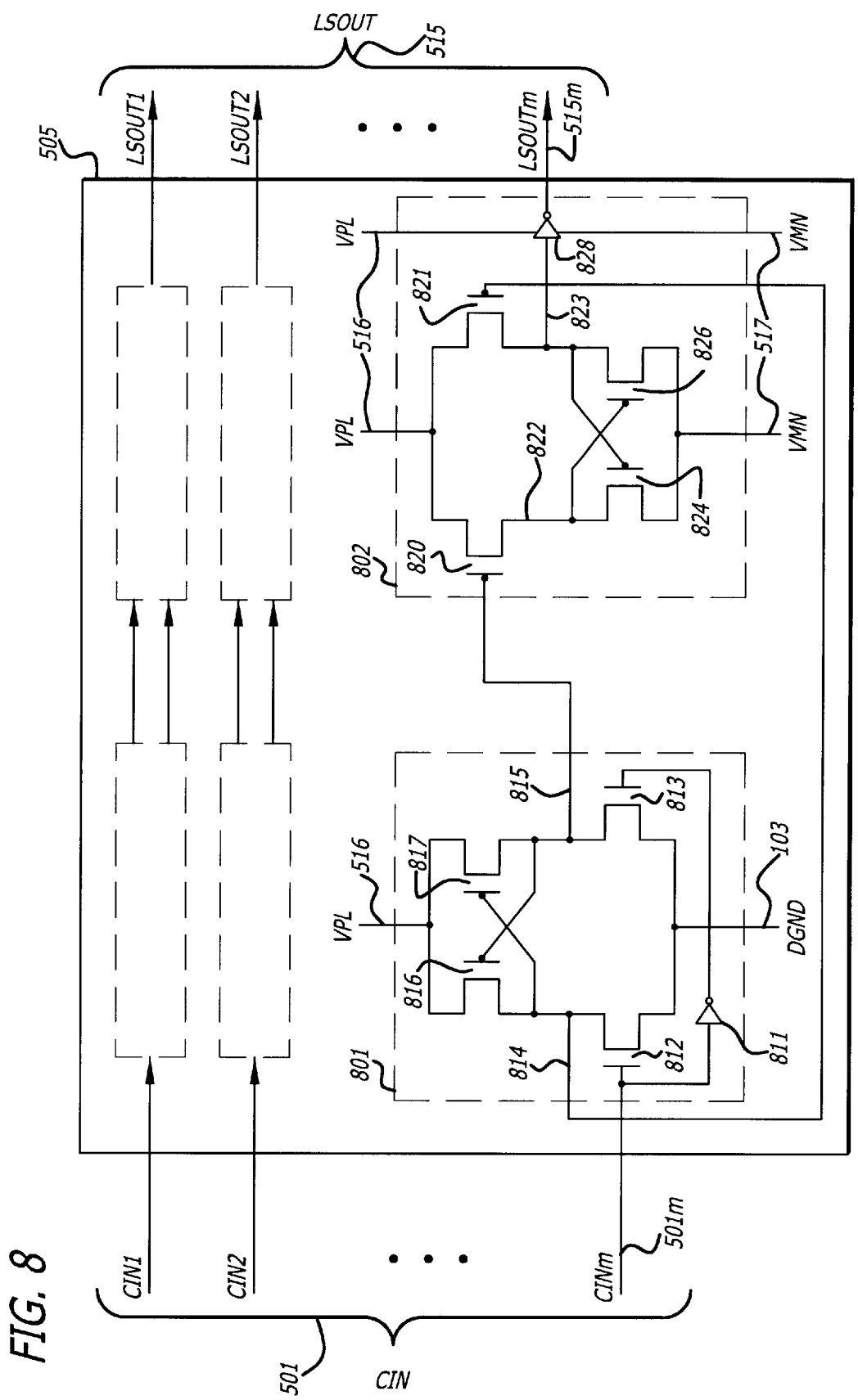
FIG. 8 is a schematic diagram of the level shifter of the present invention.

Referring now to FIG. 8, the level shifter 505 is illustrated. Level shifter 505 receives CIN 501 to generate a level shifted output signal LSOUT 515. Each of the bits received as a bit of CIN 501 is level shifted as a bit of the output LSOUT 515. The level shifting logically occurs over two circuits. The first level shift circuit 801 shifts input logic levels, usually digital CMOS voltage levels, to voltage levels of VPL 516 and DGND 103. The second shift circuit 802 receives the logic levels having voltage levels of VPL 516 and DGND 103 from the first circuit 801 and further shifts the voltages to logic levels having voltage levels of VPL 516 and VMN 517 on LSOUT 515. Using the $m^{th}$ bit as representative, CINm 501m has its signal inverted by inverter 811 which is coupled to the gate of NFET 813. Essentially, the first circuit 801 compares CINm 501m with its inverted signal from inverter 811 to generate complementary outputs having voltage levels of VPL 516 and DGND 103. The complementary outputs are then compared by the second circuit 802 to generate an output having voltage levels of VPL 516 and VMN 517. In the first shift circuit 801, NFET 812 or NFET 813 steer output 814 or 815 respectively down to DGND 103 in response to CINm 501m. Cross-coupled PFETs 816 and 817 pull up output 814 or 816, whichever is not being steered down to DGND 103 by NFET 812 or 813, up to a voltage level of VPL 516. NFETs 812 and 813 are much stronger devices than the cross-coupled PFETs 816 and 817 loads in order to flip the logic levels. Outputs 814 and 815 of the first shift circuit 801 are coupled into inputs of the second shift circuit 802 at the gates of PFET 820 and 821 respectively. PFET 820 or PFET 821 steer node 822 or node 823 up to VPL 516. Cross-coupled NFETs 824 and 826 pull down node 822 or 823, whichever is not being steered up to VPL 516, down to a voltage level of VMN 517. PFETs 820 and 821 are much stronger devices than the cross-coupled NFETs 824 and 826 loads in order to flip the logic levels. Buffer 828 buffers node 823 from loads and drives the opposite voltage level of node 823 onto LSOUTm 515m. Buffer 828 drives LSOUTm between voltage levels of VPL 516 and VMN 517. The output LSOUT 515 is a non-inverted output with respect to the input CIN 501.

Figure 9:
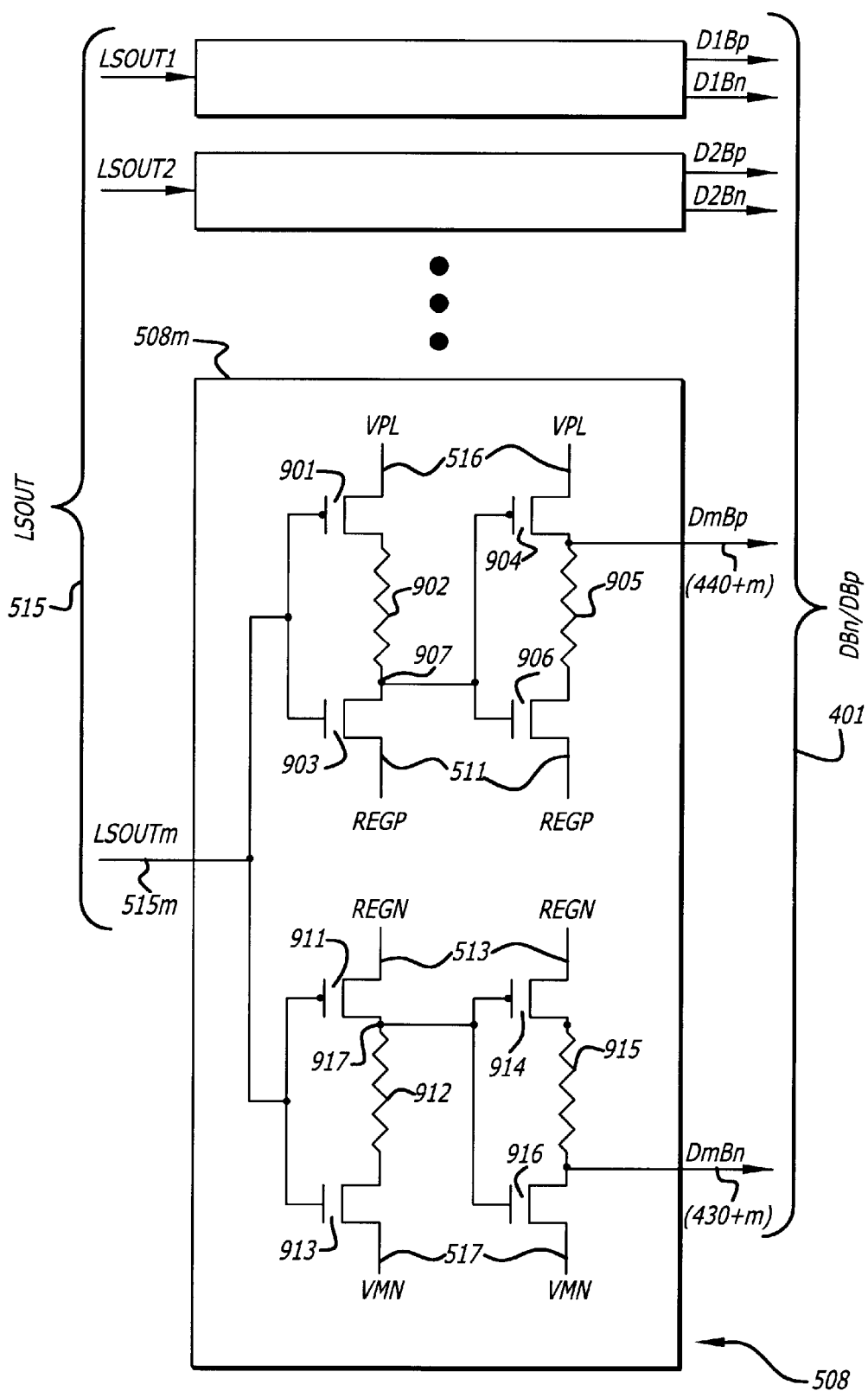
FIG. 9 is a schematic diagram of the switch drivers of the present invention.

Referring now to FIG. 9, switch drivers 508 are illustrated. The switch drivers 508 receive each bit of the level shifted output LSOUT 515 and generate two switch control signals of the DBn/DBp signal 401 for each input bit. As described with reference to FIG. 4, the DBn/DBp signal 401 is coupled to the switch control terminals of the switches in the switched R-2R ladder 416. Switch drivers 508 buffer the capacitive load of the switches and the switch control lines from the level shifter 505, apply appropriate voltage level for proper switch operation, and further perform break before make switch timing. A schematic for each switch driver pair for each input bit of LSOUT 515 is illustrated in FIG. 9. The $m^{th}$ bit being representative of each bit, the switch driver pair 508m is a pair of buffers in parallel generating the same non-inverted output signal on DmBp (440+m) and DmBn (430+m) but with different timing to perform the break before make switch timing. The two series inverters, forming a buffer for driving the control terminal of the PFET switch coupled to DmBp (440+m), consist of the PFET 901, resistor 902, and NFET 903; and PFET 904, resistor 905, and NFET 906 being coupled as shown in FIG. 9. The two series inverters, forming a buffer for driving the control terminal of the NFET switch coupled to DmBn (430+m), consist of the PFET 911, resistor 912, and NFET 913; and PFET 914, resistor 915, and NFET 916 being coupled as shown in FIG. 9.

To turn the NFET switches ON in the R-2R ladder 416, the voltage REGN 513 is applied by the switch drivers 508 to the gates of the NFET switches. To turn the NFET switches OFF, the voltage VMN 517 is applied by the switch drivers 508 to the gates of the NFET switches. To turn ON the PFET switches, the voltage REGP 511 is applied by the switch drivers 508 to the gates of the PFET switches. To turn OFF the PFET switches, the voltage VPL 516 is applied by the switch drivers to the gates of the PFET switches. Thus, the buffer driving PFET switches has VPL 516 as the positive power supply, for the turn OFF voltage level, and REGP 511 as the negative power supply, for the turn ON voltage level. The buffer driving NFET switches has REGN 513 as the positive power supply, for the turn ON voltage level, and VMN 517 as the negative power supply, for the turn OFF voltage level.

The outputs DmBp (440+m) and DmBn (430+m) respectively drive an NFET and PFET switch within the same leg of the switched R-2R ladder 416 and provide break before make control signal timing to avoid crowbar currents. The break before make timing control is a pair of one sided delays. The break before make timing control provides the one sided delays by delaying the pulldown of the buffer driving the PFET switches and delaying the pullup of the buffer driving the NFET switches. In each switch driver pair 508m, resistors 902 and 905 in conjunction with the capacitive loads on nodes 907 and DmBp (440+m) cause the buffer driving the output DmBp (440+m) to have a weak pulldown, delaying the transition of the output to a low logic level. In each switch driver pair 508m, resistors 912 and 915 in conjunction with the capacitive loads on nodes 917 and DmBn (430+m) cause the buffer driving the output DmBn (430+m) to have a weak pullup, delaying the transition of the output to a high logic level.

Figure 10:
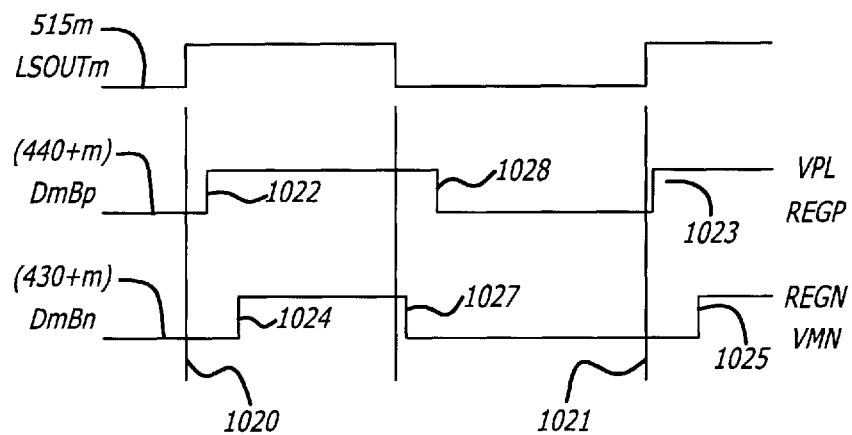
FIG. 10 is a timing diagram of break before make timing signals generated by the switch drivers of FIG. 9.

Referring now to FIG. 10, a timing diagram of signals providing the break before make timing for the $M^{th}$ bit is illustrated. As illustrated in FIG. 10, DmBp (440+m) has a logic low level of REGP 511 and a logic high level of VPL 516. DmBn (430+m) has a logic low level of VMN 517 and a logic high level of REGN 513. Input LSOUTm 515m to the switch driver pair 508m is illustrated changing state in FIG. 10 at times 1020, 1021, and 1026. When LSOUTm 515m changes state, the switch driver pair 508m causes outputs DmBp (440+m) and DmBn (430+m) to change state. At times 1020 and 1021, LSOUTm 515 goes logically high causing the PFET switch to turn OFF and the NFET switch to turn ON. At the rising edges 1022 and 1023 of DmBp (440+m), the PFET switch is first turned OFF before the NFET switch is turned ON at rising edges 1024 and 1025 of DmBn (430+m). At time 1026, LSOUTm 515m goes logically low causing the NFET switch to turn OFF and the PFET switch to turn ON. At the falling edge 1027 of DmBn (430+m) the NFET switch is turned OFF before the PFET switch is turned ON at the falling edge 1028 of DmBp (440+m).

Figure 11:
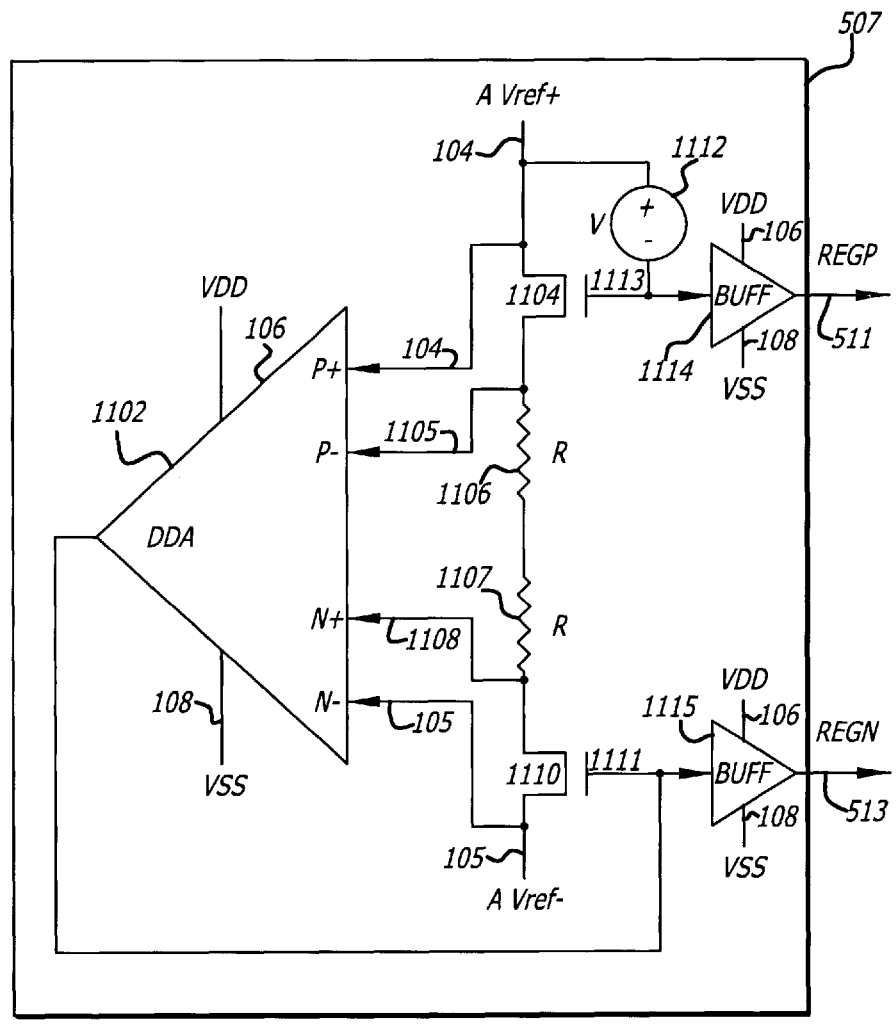
FIG. 11 is a schematic diagram of the and switch resistance match circuit of the present invention.

Referring now to FIG. 11, a schematic diagram of the switch regulator 507 is illustrated. REGP 511 is preferably a fixed voltage with respect to AVref+ such that AVref+−REGP is a fixed value. The fixed value is preferably six volts in the preferred embodiment. REGN 513 is a regulated gate voltage level for NFET switches in the R-2R ladder. A servo control loop in the switch regulator 507 regulates the voltage level of REGN such that RON(NFET)=RON(PFET).

The switch regulator 507 includes a dual differential operational amplifier (DDA) 1102, a PFET 1104, a first resistor 1106, a second resistor 1107, an NFET 1110, a voltage generator 1112, a first buffer 1114, and a second buffer 1115. Regarding switch resistance matching, the switch regulator 507 compares the resistance of PFET switch 1104 with the resistance of NFET switch 1110, modeling the resistance of the PFET and NFET switches respectively within the R-2R ladder 416. Recall that REGP 511 and REGN 513, generated by the switch regulator 507, provide the turn ON voltage levels respectively for the PFETs and NFETs of the switched R-2R ladder 416. Because of the voltage generator 1112, REGP 511 forms a constant gate to source voltage level for the PFET switches of the R-2R ladder such that their ON resistance is fixed. The formation of REGP 511 is important in that it eliminates wide variations of resistance in the PFET switches for the wide range of values for AVref+ 104. The ON resistance of the NFET switches in the switched R-2R ladder is adjusted to match the ON resistance of the PFET switches through variations in REGN 513 voltage. REGN 513 voltage is continuously updated via the servo control loop in the switch resistance match circuit 507. The formation of REGP 511, reduces the variability of the PFET switches and reduces the variation of resistance of the NFET switches switching the AVref− 105. Additionally, the NFETs 236–239 in prior art ladders are preferably eliminated from switched R-2R ladders in order to avoid switch breakdown and to minimize the range of values for REGN 513 required to provide resistance matching. The switch regulator 507 servos the gate voltage level (REGN) for the NFET 1110 until the resistance of PFET switch 1104 is equal to the resistance of the NFET switch 1110, modeling the resistance of the PFET and NFET switches respectively within the R-2R ladder 416. In order to keep the voltage level of REGN 513 from servoing beyond the breakdown voltage of the PFET in the switch driver circuitry 508, REGN 513 is clamped to VPL.

Regarding formation of the positive and negative switch ON voltage levels, the switch regulator 507 includes the voltage generator 1112 preferably generating a substantially fixed voltage VREFSHIFT in the range between six volts to six and one-half volts. Voltage generator 1112 is similarly constructed from a current source, resistor, and capacitor as used for VPL 516 in FIG. 6. The voltage generator 1112 ensures that the voltage on node 1113 is VREFSHIFT volts below the voltage level of AVref+ 104 reducing the voltage level of AVref+ to generate REGP 511 and provide a sufficient voltage level to turn ON the PFET switches in the switched R-2R ladder.

Buffers 1114 and 1115 buffer loads on REGP 511 and REGN 513 from nodes 1113 and 1111 respectively. Buffer 1114 provides a voltage level on its output REGP 511 substantially similar to the voltage level on node 1113. Thus, as AVref+ 104 is raised or lowered, the voltage on REGP 511 reduced by VREFSHIFT follows the variation in AVref+ 104. Buffer 1115 provides on its output REGN 513 a voltage level substantially similar to the voltage level on node 1111. The voltage level on node 1111 is a function of the gate to source voltage of NFET 1110 and the voltage level of AVref− 105. Thus, the voltage level of REGN 513 is first responsive to the voltage level of AVref− 105.

Because nodes 1113 and 1111 are relatively high impedance, diode clamps (not shown) are provided at the input to the buffers 1114 and 1115. The diode clamp at node 1113 clamps at the voltage level of VMN 517, in the preferred embodiment negative four and one half volts, such that REGP 511 does not go below the voltage level of VMN 517. This avoids exceeding the gate to source breakdown voltage or switch breakdown voltage of the PFET switches. The diode clamp at node 1111 clamps at the voltage level of VPL 516, in the preferred embodiment positive six and one half volts, such that REGN 513 does not go above the voltage level of VPL 516. This avoids exceeding the gate to source breakdown voltage or switch breakdown voltage of the NFET switches.

The dual differential operational amplifier (DDA) 1102 has AVref− 105 input at its N− input terminal and node 1108 input at its N+ input terminal, node 1105 input at its P− input terminal, and AVref+ 104 input at its P+ input terminal. The DDA 1102 determines the voltage difference between its P+ and P− input terminals and the voltage difference between its N+ and N− input terminals and compares these two voltage differences against each other. A higher magnitude of drain to source voltage indicates a higher resistance level for the respective switch. If it is determined that the NFET 1110 has a higher resistance than the PFET 1104, output 1111 from the DDA 1102 is increased to increase the gate to source voltage across the NFET 1110 thereby reducing its resistance. If it is determined that the resistance of the PFET 1104 is greater than the resistance of NFET 1110, output 1111 of the DDA 1102 is decreased thereby reducing the gate to source voltage applied to the NFET 1110 and increasing its resistance to match the resistance of the PFET 1104. Increases or decreases in the gate to source voltage of NFET 1110, increase or decrease the voltage level of REGN 513 respectively. Thus, the voltage level of REGN 513 is secondly responsive to matching switch resistances.

The preferred embodiments of the present invention for METHOD AND APPARATUS FOR SWITCHING LOW VOLTAGE CMOS SWITCHES IN HIGH VOLTAGE DIGITAL TO ANALOG CONVERTERS are thus described. While the present invention has been described in particular embodiments, the present invention should not be construed as limited by such embodiments, but rather construed according to the claims that follow below.

What is claimed is:

1. A switch controller to receive a digital input signal and a range of power supply voltages to control switches receiving a range of analog reference voltages, wherein the range of power supply voltages can meet or exceed a switch breakdown voltage of the switches, the switch controller comprising:

a switch OFF voltage generator to receive the range of power supply voltages, the switch OFF voltage generator to generate a positive generated OFF voltage greater than a positive analog reference voltage and a negative generated OFF voltage less than a negative analog reference voltage, the voltage range between the positive and negative generated OFF voltages less than the switch breakdown voltage;

a switch ON voltage generator to receive the range of power supply voltages and the range of analog reference voltages, the switch ON voltage generator to form a positive ON voltage less positive than the positive analog reference voltage by a predetermined voltage and to form a negative ON voltage more positive than the negative analog reference voltage by a variable voltage; and a plurality of switch driver pairs coupled to the switch ON voltage generator to receive the positive and negative ON voltages and the switch OFF voltage generator to receive the positive and negative generated OFF voltages, the plurality of switch driver pairs to translate the digital input signal into the positive ON and positive generated OFF voltages or the negative ON and the negative generated OFF voltages and to couple them to the switch control terminals of the switches in response to the digital input signal, the switch controller to control the switches without meeting or exceeding the switch breakdown voltage of the switches.

2. The switch controller of claim 1, further comprising:

a digital input level shifter coupled to the switch OFF voltage generator to receive the positive and negative generated OFF voltages and the plurality of switch driver pairs, the digital input level shifter to receive the digital input signal and to shift high and low logic levels of the digital input signal having digital input voltage levels into high and low logic levels having positive and negative generated OFF voltage levels to couple to the plurality of switch driver pairs.

3. The switch controller of claim 2, further comprising:

a transistor-transistor logic/complementary metal oxide semiconductor (TTL/CMOS) input receiver coupled to the digital input level shifter, the TTL/CMOS input receiver to receive the digital input signal having digital input levels prior to the digital input signal being received by the digital input level shifter and to translate the digital input signal having digital input levels into a digital input signal having CMOS digital input levels.

4. The switch controller of claim 2, wherein, the digital input level shifter comprises, a first level shifting stage coupled to the switch OFF voltage generator to receive the positive generated OFF voltage and to receive the digital input signal having digital input voltage levels, the first level shifting stage to invert the digital input signal to generate an inverted digital input signal and to compare the digital input signal with the inverted digital input signal to generate complimentary outputs having logic levels with voltages of ground and the positive generated OFF voltage; and a second level shifting stage coupled to the switch OFF voltage generator to receive the positive and negative generated OFF voltages and further coupled to the complimentary outputs of the first level shifting stage to receive the digital input signal having logic levels with voltages of ground and the positive generated OFF voltage, the second level shifting stage to compare the complimentary outputs of the first level shifting stage to generate a level shifted output having logic levels with voltages of the negative generated OFF voltage and the positive generated OFF voltage.

5. The switch controller of claim 2, wherein a switch driver of the plurality of switch driver pairs comprises, a first inverter stage having an input coupled to the digital input level shifter to receive the digital input signal having high and low logic levels with positive and negative generated OFF voltage levels, the first inverter stage to invert the digital input signal to generate a first inverted output signal;

a second inverter stage having an input coupled to an output of the first inverter stage to receive the first inverted output signal, the second inverter stage to invert the first inverted output signal to generate a switch control signal for a switch; and the first inverter stage and the second inverter stage having positive and negative supply terminals coupled to the switch OFF voltage generator and to the switch ON voltage generator, the first and second inverter stages to receive the positive generated OFF voltage and the positive ON voltage to generate high and low logic levels having the positive generated OFF voltage and the positive ON voltage respectively.

6. The switch controller of claim 2, wherein a switch driver of the plurality of switch driver pairs comprises, a first inverter stage having an input coupled to the digital input level shifter to receive the digital input signal having high and low logic levels with positive and negative generated OFF voltage levels, the first inverter stage to invert the digital input signal to generate a first inverted output signal;

a second inverter stage having an input coupled to an output of the first inverter stage to receive the first inverted output signal, the second inverter stage to invert the first inverted output signal to generate a switch control signal for a switch; and the first inverter stage and the second inverter stage having a positive and negative supply terminals coupled to the switch OFF voltage generator and to the switch ON voltage generator, the first and second inverter stages to receive the negative generated OFF voltage and the negative ON voltage to generate low and high logic levels having the negative generated OFF voltage and the negative ON voltage respectively.

7. The switch controller of claim 1, wherein, the switches are P-channel field effect transistor (PFET) switches having gate to source breakdown voltage and a drain to source breakdown voltage.

8. The switch controller of claim 7, wherein, a gate of each of the PFET switches is the switch control terminal coupled to one of the plurality of switch driver pairs to receive the selectively coupled positive ON voltage or the positive generated OFF voltage in response to the digital input signal.

9. The switch controller of claim 1, wherein, the switches are N-channel field effect transistor (NFET) switches having gate to source breakdown voltage and a drain to source breakdown voltage.

10. The switch controller of claim 9, wherein, a gate of each of the NFET switches is the switch control terminal coupled to one of the plurality of switch driver pairs to receive the selectively coupled negative ON voltage or the negative generated OFF voltage in response to the digital input signal.

11. The switch controller of claim 9, wherein, other switches are P-channel field effect transistor (PFET) switches having gate to source breakdown voltage and a drain to source breakdown voltage.

12. The switch controller of claim 11, wherein, a gate of each of the NFET switches is the switch control terminal coupled to one of the plurality of switch driver pairs to receive the selectively coupled negative ON voltage or the negative generated OFF voltage in response to the digital input signal; and a gate of each of the PFET switches is another switch control terminal coupled to another one of the plurality of switch driver pairs for receiving the selectively coupled positive ON voltage or the positive generated OFF voltage in response to the digital input signal.

13. The switch controller of claim 1, wherein,
the switch ON voltage generator further to perform a matching of switch resistance between the switches receiving the positive analog reference voltage and the switches receiving the negative analog reference voltage, the switch ON voltage generator to modify the variable voltage to generate the negative ON voltage further responsive to equalizing a difference in switch resistance.

14. The switch controller of claim 1, wherein,
the breakdown voltage is twelve volts, the positive power supply voltage can vary from seven to fourteen volts, the negative power supply voltage can vary from negative five to negative nine volts, the positive analog reference voltage can vary from zero to six volts and the negative analog reference voltage can vary from zero to negative four volts such that the switch OFF voltage generator preferably generates positive and negative generated OFF voltages substantially fixed to values of six and one-half volts and negative four and one-half volts respectively.

15. The switch controller of claim 1, wherein the switch OFF voltage generator comprises,
a first current source coupled to the positive power supply and coupled in series with a first resistor coupled to ground to generate the positive generated OFF voltage and a first capacitor coupled in parallel to the first resistor.

16. The switch controller of claim 15, wherein the switch OFF voltage generator further comprises,
a second resistor coupled to ground and a second current source coupled in series to the second resistor and to the negative power supply to generate the negative generated OFF voltage and a second capacitor coupled in parallel to the second resistor.

17. The switch controller of claim 1, wherein, the switch ON voltage generator comprises,
a second voltage generator coupled between the positive analog reference voltage and a control terminal of a first switch to generate the positive ON voltage,
the first switch having a supply terminal coupled to the positive analog reference voltage,
a resistor coupled to a switched terminal of the first switch and a switched terminal of a second switch;
the second switch having a supply terminal coupled to the negative analog reference voltage; and
a dual differential operational amplifier (DDA) having an output coupled to a control terminal of the second switch to generate the negative ON voltage thereon, a first positive input terminal coupled to the positive analog reference voltage, a first negative input terminal coupled to the switched terminal of the first switch, a second positive input terminal coupled to the switched terminal of second switch, and a second negative input terminal coupled to the negative analog reference voltage, the DDA to determine a first voltage drop across the first switch and a second voltage drop across the second switch and to compare the first voltage drop with the second voltage drop to form the negative ON voltage responsive to a difference between the first voltage drop and the second voltage drop to cause the first voltage drop and the second voltage drop to become equal.

18. A digital to analog converter (DAC) to receive a range of analog reference voltages and a range of power supply voltages meeting or exceeding a switch breakdown voltage, the DAC to convert a digital input signal having digital input levels into a voltage level of an analog voltage signal within the range of analog reference voltages, the DAC comprising:

a plurality of digital input terminals to receive the digital input signal having digital input levels, an analog output terminal to output the voltage level of the analog voltage signal, and positive and negative power supply terminals to respectively receive a positive power supply voltage greater than a positive analog reference voltage and a negative power supply voltage less than a negative analog reference voltage;

a switched R-2R ladder coupled to the analog output terminal and having switches and an R-2R resistance ladder to generate the voltage level of the analog voltage signal responsive to the digital input signal on the analog output terminal, each of the switches having the switch breakdown voltage and a first switch OFF and a first switch ON voltage levels or a second switch OFF and a second switch ON voltage levels, the switched R-2R ladder to receive the positive and negative analog reference voltages and a plurality of switch control signals with each switch control signal coupled to a control terminal of one of the switches;

a voltage generator coupled to the positive and negative power supply terminals to receive the positive power supply voltage greater than the positive analog reference voltage and the negative power supply voltage less than the negative analog reference voltage, the voltage generator to generate a substantially fixed positive generated OFF voltage greater than the positive analog reference voltage and less than the positive power supply voltage to avoid switch breakdown and provide the first switch OFF voltage level, the voltage generator further to generate a substantially fixed negative generated OFF voltage less than the negative analog reference voltage and more than the negative power supply voltage to avoid switch breakdown and provide the second switch OFF voltage level; and a switch controller coupled to the plurality of digital input terminals and the voltage generator to receive the digital input signal having digital input levels and the substantially fixed positive and negative generated OFF voltages and further coupled to each control terminal of each switch of the switched R-2R ladder to generate the plurality of switch control signals thereon, the switch controller to form a negative ON voltage responsive to the negative analog reference voltage to avoid switch breakdown and to provide the second switch ON voltage level, the switch controller further to form a positive ON voltage responsive to the positive analog reference voltage to avoid switch breakdown and to provide the first switch ON voltage level, the switch controller to generate the plurality of switch control signals having first and second switch ON and OFF voltage levels responsive to the digital input signal, the positive and negative generated OFF voltages, and the positive and negative analog reference voltages, and wherein, switch breakdown is avoided and the first and second switch OFF voltage levels and first and second switch ON voltage levels are coupled to the plurality of switch control signals.

19. The digital to analog converter (DAC) of claim 18, wherein,
the substantially fixed positive generated OFF voltage is greater than the positive analog reference voltage by at least one half of a volt.

20. The digital to analog converter (DAC) of claim 18, wherein,
the substantially fixed negative generated OFF voltage is less than the negative analog reference voltage by at least one half of a volt.

21. The digital to analog converter (DAC) of claim 20, wherein,
the substantially fixed positive generated OFF voltage is greater than the positive analog reference voltage by at least one half of a volt.

22. The digital to analog converter (DAC) of claim 18, wherein,
the switches are P-channel field effect transistor (PFET) and N-channel field effect transistor (NFET) switches and the switch breakdown voltage is the lesser of a gate to source breakdown voltage and a drain to source breakdown voltage for the PFET or NFET.

23. The digital to analog converter (DAC) of claim 22, wherein,
the PFET switches have a gate as the control terminal to receive the first switch ON and first switch OFF voltage levels of the plurality of switch control signals and the NFET switches have a gate as the control terminal to receive the second switch ON and second switch OFF voltage levels of the plurality of switch control signals.

24. The digital to analog converter (DAC) of claim 23, wherein,
the PFET switches are controlled by the switch control signals to switch the positive analog reference voltage in the switched R-2R ladder and the NFET switches are controlled by the switch control signals to switch the negative analog reference voltage in the switched R-2R ladder.

25. The digital to analog converter (DAC) of claim 18, wherein,
the digital input levels for the digital input signal are at least transistor-transistor logic (TTL) levels.

26. The digital to analog converter (DAC) of claim 18, wherein,
the digital input levels for the digital input signal are complementary metal oxide semiconductor (CMOS) levels.

27. The digital to analog converter (DAC) of claim 18, wherein,
the switch controller further to perform a matching of switch resistance between switches of the switched R-2R ladder receiving the positive analog reference voltage and switches of the switched R-2R ladder receiving the negative analog reference voltage, the switch ON voltage generator to modify the negative ON voltage to provide a second switch ON voltage level that equalizes the switch resistance.

28. The digital to analog converter (DAC) of claim 27, wherein,
the switch controller provides a higher second switch ON voltage level to match the resistance of the switches switching the negative analog reference voltage with switches switching the positive analog reference voltage.

29. The digital to analog converter (DAC) of claim 27, wherein,
the switch controller provides a lower second switch ON voltage level to match the resistance of the switches switching the negative analog reference voltage with the switches switching the positive analog reference voltage.

30. A method for switching switches in a digital to analog converter having a switch breakdown voltage less than or equal to a power supply voltage range to convert a digital input signal having digital input signal levels into an analog output signal, the method comprising:
a) providing a switched R-2R ladder having switches to generate the analog output signal in response to the digital input signal, each switch having a switch control terminal and the switch breakdown voltage;
b) receiving a positive power supply and a negative power supply having the power supply voltage range greater than or equal to the switch breakdown voltage;
c) receiving a positive analog reference voltage and a negative analog reference voltage, the range between the positive analog reference voltage and the negative analog reference voltage being less than the switch breakdown voltage;
d) generating a positive substantially fixed generated OFF voltage greater than the positive analog reference voltage and a negative substantially fixed generated OFF voltage less than the negative analog reference voltage, the range of voltage between the positive generated OFF voltage and the negative generated OFF voltage being less than the switch breakdown voltage;
e) forming a positive ON voltage and a negative ON voltage respectively in response to the positive analog reference voltage and the negative analog reference voltage, the positive ON voltage being less positive than the positive analog reference voltage by a predetermined voltage level and the negative ON voltage being more positive than the negative analog reference voltage by a variable voltage level;
f) receiving the digital input signal having digital input signal levels and shifting the voltage levels of the digital input signal into the positive and negative generated OFF voltage levels for a high logic level input or a low logic level input to generate a shifted digital input signal; and
g) coupling the positive or negative generated OFF voltage to switch control terminals and the positive or negative ON voltage to switch control terminals to switch switches in a digital to analog converter and to avoid switch breakdown.

31. The method of claim 30 for switching switches in a digital to analog converter, wherein,
the coupling couples the positive generated OFF voltage to switch control terminals to turn OFF switches switching the positive analog reference voltage into the R-2R ladder and couples the positive ON voltage to switch control terminals to turn ON switches switching the positive analog reference voltage into the R-2R ladder to properly operate the switches and avoid switch breakdown.

32. The method of claim 30 for switching switches in a digital to analog converter, wherein,
the coupling couples the negative generated OFF voltage to switch control terminals to turn OFF switches switching the negative analog reference voltage into the R-2R ladder and couples the negative ON voltage to switch control terminals to turn ON switches switching the negative analog reference voltage into the R-2R ladder to properly operate the switches and avoid switch breakdown.

33. The method of claim 30 for switching switches in a digital to analog converter, wherein,
the coupling couples the positive generated OFF voltage to switch control terminals to turn OFF switches switching the positive analog reference voltage into the R-2R ladder and couples the positive ON voltage to switch control terminals to turn ON switches switching the positive analog reference voltage into the R-2R ladder to properly operate the switches and avoid switch breakdown; and the coupling couples the negative generated OFF voltage to switch control terminals to turn OFF switches switching the negative analog reference voltage into the R-2R ladder and couples the negative ON voltage to switch control terminals to turn ON switches switching the negative analog reference voltage into the R-2R ladder to properly operate the switches and avoid switch breakdown.

34. The method of claim 30 for switching switches in a digital to analog converter, wherein, the forming of the positive ON voltage and the negative ON voltage is further responsive to a comparison of a first switch resistance with a second switch resistance by modifying the predetermined voltage or variable voltage values.

35. The method of claim 30 for switching switches in a digital to analog converter, wherein, the range of voltage between the positive generated OFF voltage and the negative generated OFF voltage is greater than a maximum range between the positive analog reference voltage and the negative analog reference voltage.

36. The method of claim 30 for switching switches in a digital to analog converter, wherein, a center voltage of the range of voltage between the positive generated OFF voltage and the negative generated OFF voltage is equal to a center voltage of a maximum range between the positive analog reference voltage and the negative analog reference voltage.

37. The method of claim 30 for switching switches in a digital to analog converter, wherein, the positive ON voltage is formed by subtracting the predetermined voltage level from the voltage level of the positive analog reference voltage and the negative ON voltage is formed by adding the variable voltage level to voltage level of the negative analog reference voltage.

38. The method of claim 30 for switching switches in a digital to analog converter, wherein, the positive ON voltage provides a constant gate to source voltage level for providing a constant resistance value for PFET switches for a given range of voltage between the positive analog reference voltage and the negative analog reference voltage and the negative ON voltage provides a variable gate to source voltage level for providing a variable resistance value for NFET switches to match a resistance of the NFET switches with a resistance of the PFET switches.

39. A method for providing a range of an analog output signal in a digital to analog converter exceeding a switch breakdown voltage, the digital to analog converter to convert a digital input signal having digital input signal levels into the analog output signal, the method comprising:

a) providing a switched R-2R ladder having switches to generate an intermediate analog output signal in response to the digital input signal, each switch having a switch control terminal and the switch breakdown voltage;

b) providing an amplifier coupled to the switched R-2R ladder, the amplifier having a gain greater than one;

c) the switched R-2R ladder generating the intermediate analog output signal in response to the digital input signal; and d) the amplifier amplifying the intermediate analog output signal using the gain greater than one into the analog output signal having the range exceeding the switch breakdown voltage of the switches in the switched R-2R ladder.

40. A method for providing a range of an analog output signal in a digital to analog converter exceeding a switch breakdown voltage, the digital to analog converter to convert a digital input signal having digital input signal levels into the analog output signal, the method comprising:

a) providing a switched R-2R ladder having switches to generate an intermediate analog output signal in response to the digital input signal, each switch having a switch control terminal and the switch breakdown voltage;

b) providing an amplifier coupled to the switched R-2R ladder, the amplifier having a gain greater than one;

c) the switched R-2R ladder generating the intermediate analog output signal in response to the digital input signal and the amplifier receiving the intermediate analog output signal and amplifying it with a gain greater than one into the analog output signal having the range exceeding the switch breakdown voltage; and d) providing a switch controller to control the switches in the switched R-2R ladder;

the switch controller, i) receiving a positive analog reference voltage and a negative analog reference voltage, the range between the positive analog reference voltage and the negative analog reference voltage being less than the switch breakdown voltage;

ii) generating a positive substantially fixed generated OFF voltage greater than the positive analog reference voltage and a negative substantially fixed generated OFF voltage less than the negative analog reference voltage, the range of voltage between the positive generated OFF voltage and the negative generated OFF voltage being less than the switch breakdown voltage;

iii) forming a positive ON voltage and a negative ON voltage respectively in response to the positive analog reference voltage and the negative analog reference voltage, the positive ON voltage being less positive than the positive analog reference voltage by a predetermined voltage level and the negative ON voltage being more positive than the negative analog reference voltage by a variable voltage level;

iv) receiving the digital input signal having digital input signal levels and shifting the voltage levels of the digital input signal into the positive and negative generated OFF voltage levels for a high logic level input or a low logic level input to generate a shifted digital input signal; and v) coupling the positive or negative generated OFF voltage to switch control terminals and the positive or negative ON voltage to switch control terminals for switching switches in a digital to analog converter and avoiding the switch breakdown voltage.

41. The method of claim 39, further comprising:

e) providing a switch controller to control the switches in the switched R-2R ladder and to generate the analog output signal exceeding the switch breakdown voltage of the switches, the switch controller receiving high voltage power supply levels exceeding the switch breakdown voltage of the switches and shifting the power supply voltage levels to safe control voltage levels to control the switches in response to the digital input signal.

42. The method of claim 41, wherein, the switch controller further to translate the digital input signal from a TTL signal level to a CMOS signal level.

43. The method of claim 41, wherein, the switch controller further to drive the switch control terminal of each switch with a control voltage not exceeding the switch breakdown voltage.

44. The method of claim 40, wherein, the digital input signal is a TTL level digital input signal.

45. The method of claim 40, wherein, the digital input signal is a CMOS level digital input signal.

46. A method for converting a digital input signal having digital input signal levels into an analog output signal having a voltage range exceeding a switch breakdown voltage, the method comprising:

level shifting high voltage power supply levels exceeding the switch breakdown voltage to safe control voltage levels not exceeding the switch breakdown voltage;

switching switches in a switched R-2R ladder using the safe control voltage levels to generate an intermediate analog output signal in response to the digital input signal, the switches in the switched R-2R ladder having the switch breakdown voltage; and amplifying the intermediate analog output signal by a gain greater than one to generate the analog output signal having the voltage range exceeding the switch breakdown voltage of the switches in the switched R-2R ladder.

47. The method of claim 46, wherein, the switching switches includes driving switch control terminals of the switches with the safe control voltage levels.

48. The method of claim 46, wherein, the switching switches includes translating the digital input signal from a TTL signal level to a CMOS signal level.

\* \* \* \* \*